(12) United States Patent
Brender et al.

(10) Patent No.: US 12,092,183 B2
(45) Date of Patent: Sep. 17, 2024

(54) SPRING MECHANISM FOR SELF-LOCK AND CENTERING DURING LOADING

(71) Applicant: KLA Corporation, Milpitas, CA (US)

(72) Inventors: Meier Brender, Monte Sereno, CA (US); Joseph Walsh, Soquel, CA (US)

(73) Assignee: KLA Corporation, Milpitas, CA (US)

( * ) Notice: Subject to any disclaimer, the term of this patent is extended or adjusted under 35 U.S.C. 154(b) by 47 days.

(21) Appl. No.: 17/816,103

(22) Filed: Jul. 29, 2022

(65) Prior Publication Data
US 2023/0052496 A1 Feb. 16, 2023

Related U.S. Application Data

(60) Provisional application No. 63/231,267, filed on Aug. 10, 2021.

(51) Int. Cl.
*F16F 1/12* (2006.01)
*F16F 15/067* (2006.01)
*F16M 13/02* (2006.01)

(52) U.S. Cl.
CPC ........... *F16F 15/067* (2013.01); *F16M 13/02* (2013.01); *F16F 1/128* (2013.01)

(58) Field of Classification Search
CPC .......... B60N 2/54; B60N 2/544; B60N 2/505; A47C 7/443; F16F 1/128; F16F 2230/0052; F16F 2230/007
USPC ....... 248/559, 562, 565, 566, 571, 575, 576, 248/577, 578, 624, 625; 267/150, 169
See application file for complete search history.

(56) References Cited

U.S. PATENT DOCUMENTS

| | | | |
|---|---|---|---|
| 5,957,763 A | 9/1999 | Anderson, III et al. | |
| 5,967,923 A * | 10/1999 | Petri | F16F 9/49 474/138 |
| 8,267,356 B2 * | 9/2012 | Ohta | B60M 1/26 248/65 |

(Continued)

FOREIGN PATENT DOCUMENTS

| | | |
|---|---|---|
| CN | 212657554 U | 3/2021 |
| EP | 0915499 A2 | 5/1999 |

(Continued)

OTHER PUBLICATIONS

WIPO, International Search Report for International Application No. PCT/US2022/039886, Nov. 29, 2022.

(Continued)

*Primary Examiner* — Alfred J Wujciak
(74) *Attorney, Agent, or Firm* — Hodgson Russ LLP

(57) ABSTRACT

An apparatus includes an upper member, a lower member disposed beneath the upper member, and a spring disposed between the upper member and the lower member. The upper member has a pin extending downward therefrom. The lower member has a seat configured to receive a free end of the pin. The spring surrounds the pin, and has a free length that is less than the length of the pin. In an unloaded state, the free end of the pin contacts the seat and the spring applies a compressive force to prevent relative lateral movement between the upper member and the lower member. When the lower member carries a load in a loaded state, the load applies a tensile force to the spring that forms a gap between the free end of the pin and the seat, which allows relative lateral movement between the upper member and the lower member.

16 Claims, 14 Drawing Sheets

(56) References Cited

U.S. PATENT DOCUMENTS

| | | | |
|---|---|---|---|
| 11,193,564 B2* | 12/2021 | Guillot | F16H 7/0848 |
| 2003/0070376 A1* | 4/2003 | Abraham | E04F 15/225 |
| | | | 52/480 |
| 2006/0082038 A1* | 4/2006 | Al-Dahhan | B60G 11/16 |
| | | | 267/220 |

FOREIGN PATENT DOCUMENTS

| | | |
|---|---|---|
| JP | 2011247313 A | 12/2011 |
| KR | 1020200087656 A | 7/2020 |

OTHER PUBLICATIONS

WIPO, Written Opinion of the International Searching Authority for International Application No. PCT/US2022/039886, Nov. 29, 2022.

* cited by examiner

SPRING MECHANISM FOR SELF-LOCK AND CENTERING DURING LOADING

CROSS-REFERENCE TO RELATED APPLICATIONS

This application claims priority to the provisional patent application filed Aug. 10, 2021 and assigned U.S. App. No. 63/231,267, the disclosure of which is hereby incorporated by reference.

FIELD OF THE DISCLOSURE

This disclosure relates to kinematic couplings and, more particularly, to a kinematic coupling having a compliant assembly.

BACKGROUND OF THE DISCLOSURE

Evolution of the semiconductor manufacturing industry is placing greater demands on yield management and, in particular, on metrology and inspection systems. Critical dimensions continue to shrink, yet the industry needs to decrease time for achieving high-yield, high-value production. Minimizing the total time from detecting a yield problem to fixing it determines the return-on-investment for a semiconductor manufacturer.

Fabricating semiconductor devices, such as logic and memory devices, typically includes processing a semiconductor wafer using a large number of fabrication processes to form various features and multiple levels of the semiconductor devices. For example, lithography is a semiconductor fabrication process that involves transferring a pattern from a reticle to a photoresist arranged on a semiconductor wafer. Additional examples of semiconductor fabrication processes include, but are not limited to, chemical-mechanical polishing (CMP), etch, deposition, and ion implantation. Multiple semiconductor devices may be fabricated in an arrangement on a single semiconductor wafer and then separated into individual semiconductor devices.

Inspection processes are used at various steps during semiconductor manufacturing to detect defects on wafers to promote higher yield in the manufacturing process and, thus, higher profits. Inspection has always been an important part of fabricating semiconductor devices such as integrated circuits (ICs). However, as the dimensions of semiconductor devices decrease, inspection becomes even more important to the successful manufacture of acceptable semiconductor devices because smaller defects can cause the devices to fail. For instance, as the dimensions of semiconductor devices decrease, detection of defects of decreasing size has become necessary because even relatively small defects may cause unwanted aberrations in the semiconductor devices.

Certain inspection processes are performed using an imaging mirror assembly (IMA) directed at a target on a stage. The IMA is mounted to a passive vibration isolator assembly due to its high sensitivity to vibration. Various applications may require the IMA to be mounted and dismounted from the isolator assembly, so this connection must be highly repeatable. Other applications of semiconductor equipment or other fields may require similar types of mounting assemblies.

In a traditional kinematic coupling, three balls of a first interface are disposed in three vees of a second interface, and placement may be highly repeatable if both interfaces are rigid. However, the isolator assembly provides a complaint interface. While the IMA may fully seat with the isolator assembly, the placement will not be repeatable, and the final placement will depend on the initial load setting of the interfaces. Prior methods use a locking mechanism to constrain lateral motion of the compliant interface during loading. However, such locking mechanisms require manual action by an operator to lock and unlock the mechanism. In addition, these locking actions may create particles inside the vacuum chamber, which is intended to remain clean.

Therefore, what is needed is an improved kinematic coupling having a compliant assembly that can remain rigid during loading.

BRIEF SUMMARY OF THE DISCLOSURE

An embodiment of the present disclosure provides an apparatus comprising an upper member, a lower member, and a spring. The upper member may have a pin extending downward therefrom. The lower member may be disposed beneath the upper member and may have a seat configured to receive a free end of the pin. The lower member may be configured to carry a load in a loaded state and release the load in an unloaded state. The spring may be disposed between the upper member and the lower member and may have an upper end connected to the upper member and a lower end connected to the lower member. The spring may surround the pin, and the spring may have a free length that is less than the length of the pin. In the unloaded state, the free end of the pin may contact the seat and the spring may apply a compressive force to prevent relative lateral movement between the upper member and the lower member. In the loaded state, the load may apply a tensile force to the spring that may form a gap between the free end of the pin and the seat, which may allow relative lateral movement between the upper member and the lower member.

According to an embodiment of the present disclosure, the apparatus may further comprise a base member. The base member may be disposed beneath the lower member and may be configured to couple to the lower member. When the base member is coupled to the lower member, the base member may apply the load to the lower member, and may cause the lower member to transition from the unloaded state to the loaded state. When the base member is uncoupled from the lower member, the base member may release the load from the lower member, and may cause the lower member to transition from the loaded state to the unloaded state.

According to an embodiment of the present disclosure, the base member may comprises a post extending upward therefrom. A free end of the post may have a spherical shape with a diameter greater than a diameter of the post.

According to an embodiment of the present disclosure, the lower member may further comprise an opening. When the base member is coupled to the lower member, the free end of the post may be received in the opening.

According to an embodiment of the present disclosure, the opening may comprise a first portion and a second portion. The first portion may have a width greater than the diameter of the spherical shape, and the second portion may have a width greater than the diameter of the post and less than the diameter of the spherical shape. When the base member is coupled to the lower member, the free end of the post may be received in the first portion and the post may be at least partially received in the second portion.

According to an embodiment of the present disclosure, the lower member may further comprises a pair of internal abutment faces inside the opening. When the base member is coupled to the lower member, the spherical shape may contact the pair of internal abutment faces. The pair of internal abutment faces may be defined by tapered surfaces connecting the first portion to the second portion of the opening. The pair of internal abutment faces may be planar, such that the spherical shape may contact one point on each internal abutment face.

According to an embodiment of the present disclosure, in the loaded state, the free end of the pin may be at least partially withdrawn from the seat.

According to an embodiment of the present disclosure, the free end of the pin may have a beveled edge and the seat may comprise a countersunk hole. In the unloaded state, the free end of the pin may be received in the seat with an annular contact surface between the beveled edge and the countersunk hole.

According to an embodiment of the present disclosure, the apparatus may further comprise a bellows. The bellows may be disposed between the upper member and the lower member and may have an upper end connected to the upper member and a lower end connected to the lower member. The bellows may surround the spring. The bellows may be configured to hermetically seal an interior of the bellows from an exterior of the bellows. The bellows may be elastically deformable by a length greater than or equal to the length of the gap.

According to an embodiment of the present disclosure, the upper member may comprise a fixed constraint.

According to an embodiment of the present disclosure, the upper member may have at least three pins extending downward therefrom. The at least three pins may be equally spaced apart. The lower member may comprise at least three lower members, and the seat of each lower member may be configured to receive the free end of one of the at least three pins. The spring may comprise at least three springs disposed between the upper member and each of the at least three lower members and each spring may surround one of the at least three pins. The base member may be disposed beneath the lower member and may be configured to be coupled to each of the lower members. When the base member is coupled to each of the lower members, the base member may apply the load to each of the lower members, and may cause each of the lower members to transition from the unloaded state to the loaded state. When the base member is uncoupled from each of the lower members, the base member may release the load from each of the lower members, causing each of the lower members to transition from the loaded state to the unloaded state.

According to an embodiment of the present disclosure, the base member may comprises at least three posts extending upward therefrom. The at least three posts may be equally spaced apart, and a free end of each post may have a spherical shape with a diameter greater than a diameter of the post.

According to an embodiment of the present disclosure, each of the lower members may comprise an opening. When the base member is coupled to each of the lower members, the free ends of each of the posts may be received in the opening.

Another embodiment of the present disclosure provides apparatus comprising an upper member, a lower member, and a spring. The upper member may have a pin extending downward therefrom. The upper member may be configured to carry a load in a loaded state and release the load in an unloaded state. The lower member may be disposed beneath the upper member and may have a seat configured to receive a free end of the pin. The spring may be disposed between the upper member and the lower member and may have an upper end connected to the upper member and a lower end connected to the lower member. The spring may surround the pin, and the spring may have a free length that is greater than the length of the pin. In the unloaded state, the free end of the pin may contact the seat and the spring may apply a tensile force to prevent relative lateral movement between the upper member and the lower member. In the loaded state, the load may apply a compressive force to the spring that may form a gap between the free end of the pin and the seat, which may allow relative lateral movement between the upper member and the lower member.

According to an embodiment of the present disclosure, the apparatus may further comprise a base member. The base member may be disposed on the upper member and may be configured to couple to the upper member. When the base member is coupled to the upper member, the base member may apply the load to the upper member, and may cause the upper member to transition from the unloaded state to the loaded state. When the base member is uncoupled from the upper member, the base member may release the load from the upper member, and may cause the upper member to transition from the loaded state to the unloaded state.

According to an embodiment of the present disclosure, the base member may comprise a post extending downward therefrom. A free end of the post may have a spherical shape with a diameter greater than a diameter of the post. An upper surface of the upper member may comprise a groove. When the base member is coupled to the upper member, the free end of the post may contact the groove of the upper member.

Another embodiment of the present disclosure provides method. The method may comprise providing a suspension assembly. The suspension assembly may comprise an upper member, a lower member, and a spring. The upper member may have a pin extending downward therefrom. The lower member may be disposed beneath the upper member and may have a seat configured to receive a free end of the pin. The lower member may be configured to carry a load in a loaded state and release the load in an unloaded state. The spring may be disposed between the upper member and the lower member and may have an upper end connected to the upper member and a lower end connected to the lower member. The spring may surround the pin, and the spring may have a free length that is less than the length of the pin. In the unloaded state, the free end of the pin may contact the seat and the spring may apply a compressive force to prevent relative lateral movement between the upper member and the lower member. In the loaded state, the load may apply a tensile force to the spring that may form a gap between the free end of the pin and the seat, which may allow relative lateral movement between the upper member and the lower member.

According to an embodiment of the present disclosure, the method may further comprise coupling a base member to the lower member beneath the suspension assembly. The base member may apply the load to the lower member, and may cause the lower member to transition from the unloaded state to the loaded state.

DESCRIPTION OF THE DRAWINGS

For a fuller understanding of the nature and objects of the disclosure, reference should be made to the following detailed description taken in conjunction with the accompanying drawings, in which.

DETAILED DESCRIPTION OF THE DISCLOSURE

Although claimed subject matter will be described in terms of certain embodiments, other embodiments, including embodiments that do not provide all of the benefits and features set forth herein, are also within the scope of this disclosure. Various structural, logical, process, step, and electronic changes may be made without departing from the scope of the disclosure. Accordingly, the scope of the disclosure is defined only by reference to the appended claims.

Figure 1A:
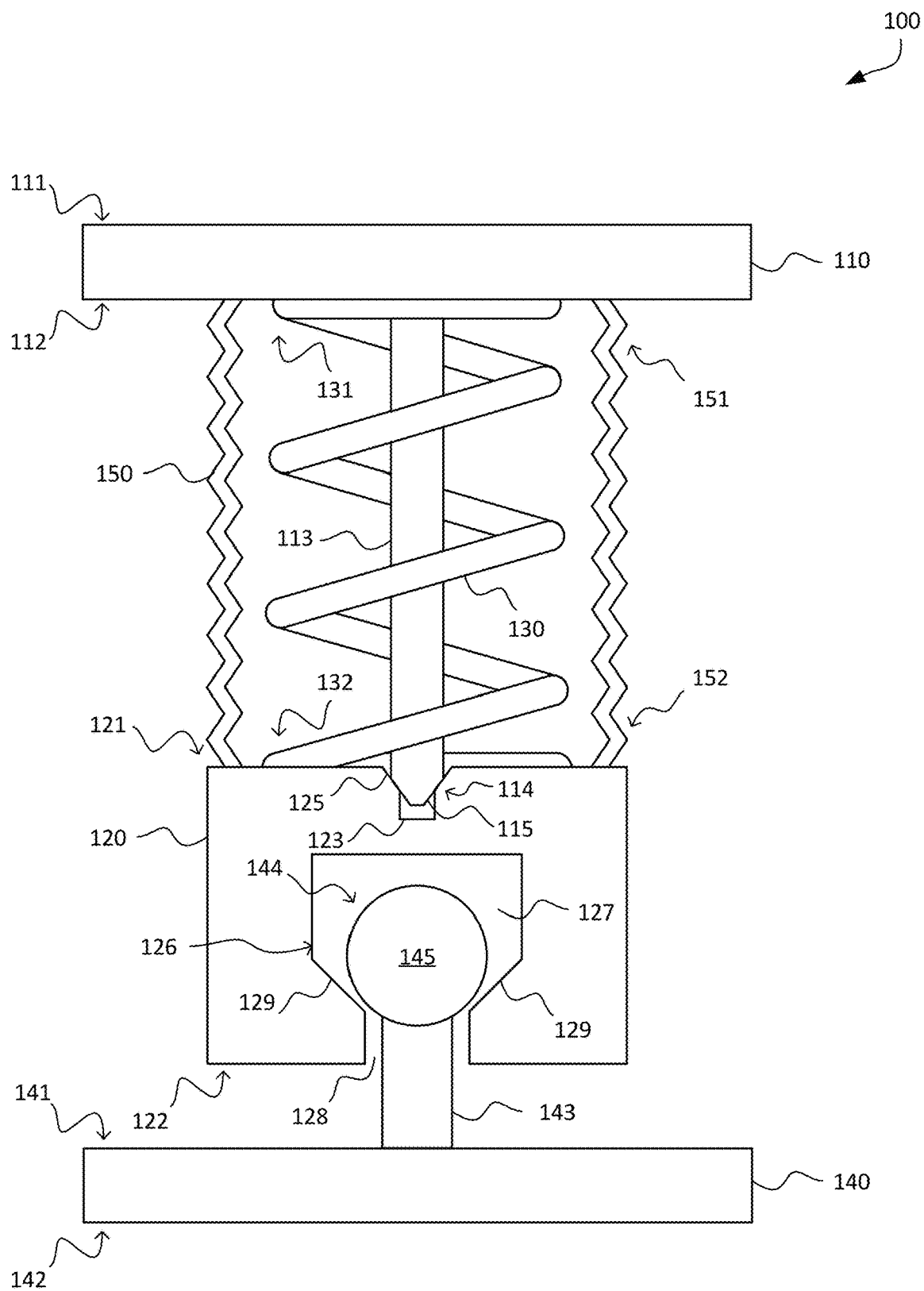
FIG. 1A is a cross-sectional view of an apparatus in an unloaded state according to an embodiment of the present disclosure.
Figure 1B:
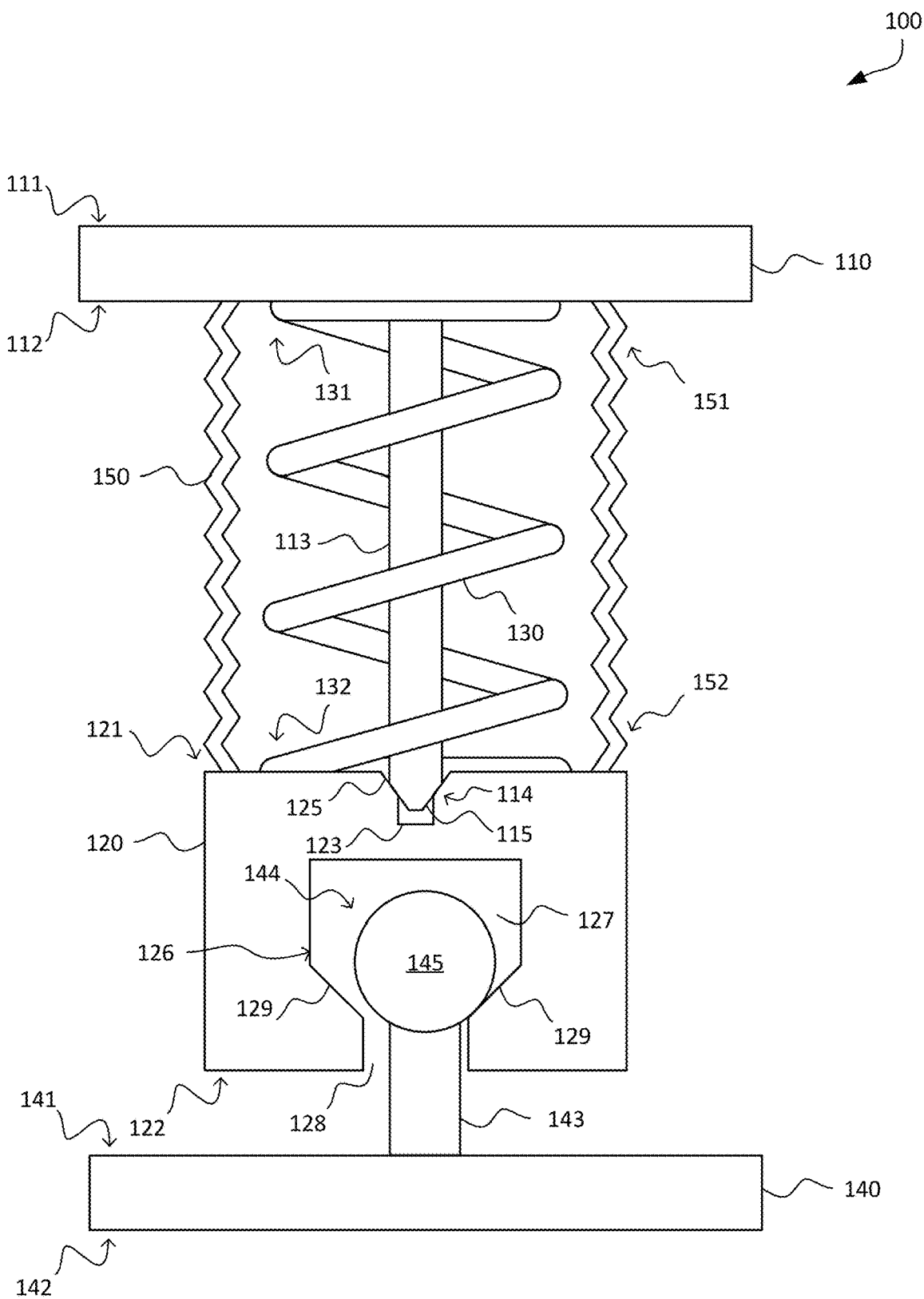
FIG. 1B is a cross-sectional view of the apparatus of FIG. 1A in a misaligned state.
Figure 1C:
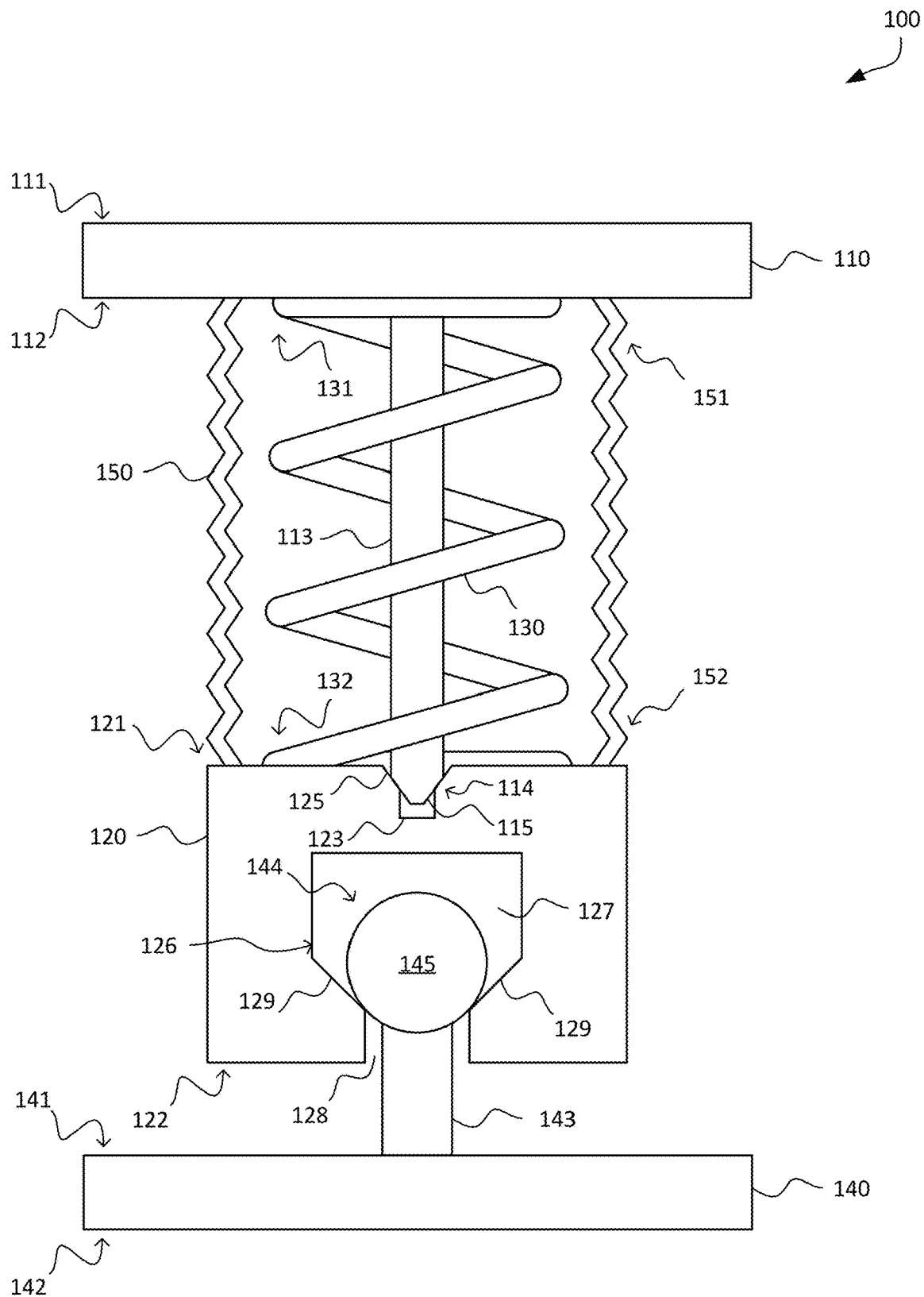
FIG. 1C is a cross-sectional view of the apparatus of FIG. 1A in a centered state.
Figure 2:
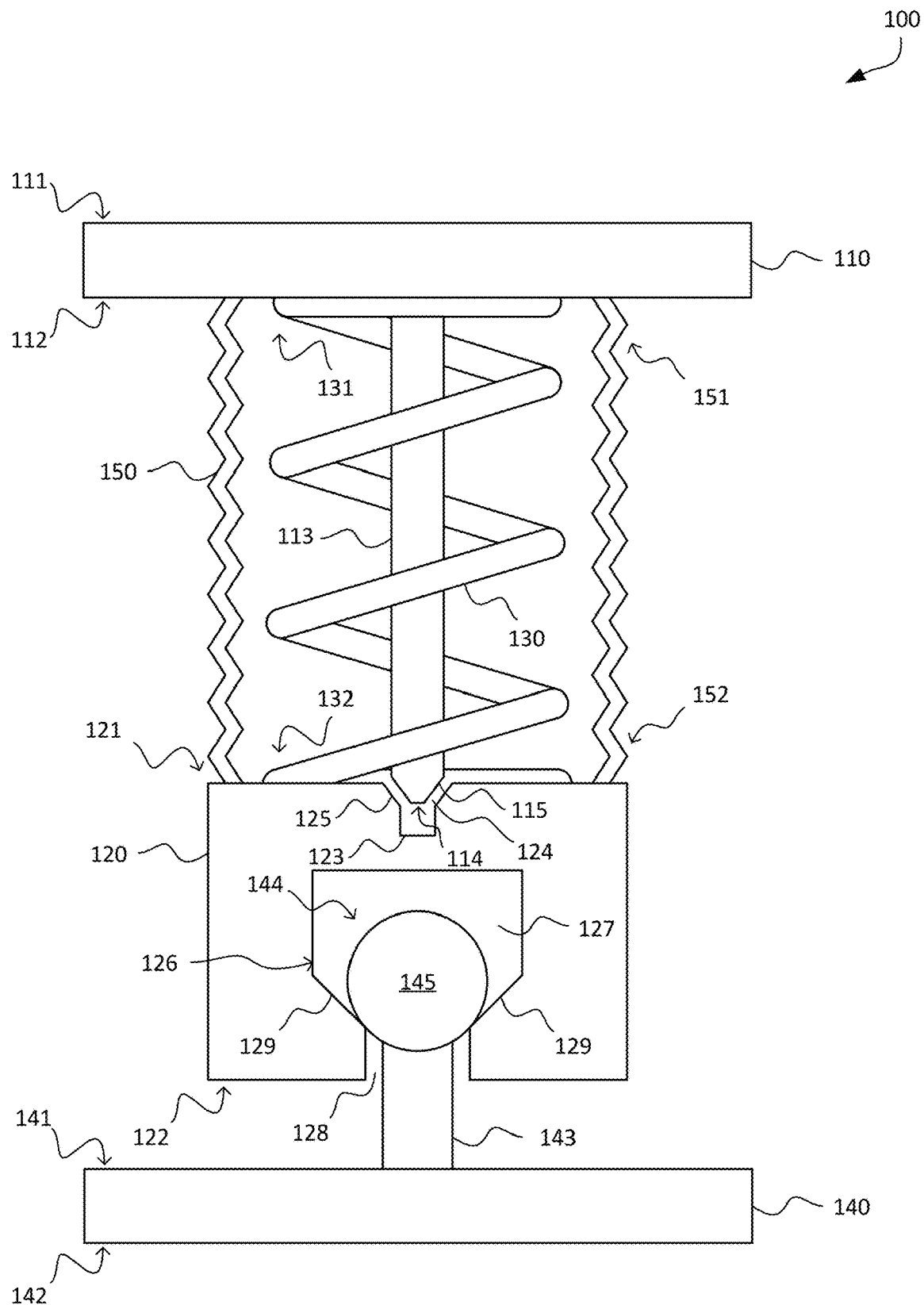
FIG. 2 is a cross-sectional view of the apparatus of FIG. 1A in a loaded state.

Referring to FIGS. 1-2, an embodiment of the present disclosure provides an apparatus 100. The apparatus 100 may comprise an upper member 110. The upper member 110 may have an upper side 111 and a lower side 112. The upper side 111 of the upper member 110 may be a fixed constraint. The lower side 112 of the upper member 110 may have a pin 113 extending downward therefrom. The pin 113 may have a cylindrical shape. The pin 113 may have a free end 114 distal from the lower side 112 of the upper member 110. The upper member 110 may have a circular or polygonal shape.

The apparatus 100 may further comprise a lower member 120. The lower member 120 may be disposed beneath the upper member 110. For example, the lower member 120 may be spaced apart from the upper member 110 in the vertical direction. The lower member 120 and the upper member 110 may be coaxially aligned. The lower member 120 may have a circular or polygonal shape. The lower member 120 may have an upper side 121 and a lower side 122. The upper side 121 of the lower member 120 may have a seat 123 configured to receive the free end 114 of the pin 113. The lower member 120 may be configured to carry a load in a loaded state and release the load in an unloaded state.

The apparatus 100 may further comprise a spring 130. The spring 130 may be a coil spring. The spring 130 may be disposed between the upper member 110 and the lower member 120. The spring 130 may have an upper end 131 connected to the upper member 110 and a lower end 132 connected to the lower member 120. For example, the upper end 131 of the spring 130 may be connected to the lower side 112 of the upper member 110, and the lower end 132 of the spring 130 may be connected to the upper side 121 of the lower member 120. The spring 130 may be connected to the upper member 110 and the lower member 120 by fasteners or welds. Alternatively, the spring 130 may be integrally formed with the upper member 110 and the lower member 120. The spring 130 may surround the pin 113. For example, the spring 130 may have an inner diameter that is greater than the diameter of the pin 113. The spring 130 may have a free length (i.e., an unloaded length) that is less than the length of the pin 113. The free length of the spring 130 and the length of the pin 113 may be set by design. For example, the free length of the spring 130 and the length of the pin 113 may depend on a combination of other parameters of the spring 130 (e.g., spring constant) and the pin 113 (e.g., diameter), to prevent the pin 113 from breaking under the force of the spring 130 in the unloaded state.

In the unloaded state shown in FIG. 1A, the free end 114 of the pin 113 contacts the seat 123, and the spring 130 applies a compressive force to prevent relative lateral movement between the upper member 110 and the lower member 120. Accordingly, the apparatus 100 may be rigid to facilitate loading. The free end 114 of the pin 113 may have a beveled edge 115 and the seat 123 may comprise a countersunk hole 125. In the unloaded state, the free end 114 of the pin 113 may be received in the seat 123 with an annular contact surface between the beveled edge 115 of the pin 113 and the countersunk hole 125 of the seat 123.

In the loaded state shown in FIG. 2, the load applies a tensile force to the spring 130 that forms a gap 124 between the free end 114 of the pin 113 and the seat 123, which allows relative lateral movement between the upper member 110 and the lower member 120. Accordingly, the apparatus 100 may be compliant to absorb vibration when loaded. In the loaded state, the free end 114 of the pin 113 may be at least partially withdrawn from the seat 123. For example, in the loaded state, the free end 114 of the pin 113 may be fully withdrawn from the seat 123. It should be understood that the size of the gap 124 may depend on the geometry of the interface between the pin 113 and the seat 123, in order to be large enough to accommodate any relative motion between the upper member 110 and the lower member 120.

The apparatus 100 may further comprise a base member 140. The base member 140 may be configured to carry any sensitive assembly that may be carried in suspension. For example, the base member 140 may be configured to carry an imaging mirror assembly (IMA), illumination assembly, laser, interferometer, or other sensitive instrumentation or components. The base member 140 may be disposed beneath the lower member 120. The base member 140 may have a circular or polygonal shape. The base member 140 may have an upper side 141 and a lower side 142. The base member 140 may be configured to couple to the lower member 120. For example, the upper side 141 of the base member 140 may be configured to couple to the lower side 122 of the lower member 120.

When the base member 140 is coupled to the lower member 120 (as shown in FIG. 2), the base member 140 may apply the load to the lower member 120, causing the lower member 120 to transition from the unloaded state to the loaded state.

When the base member 140 is uncoupled from the lower member 120 (as shown in FIG. 1A), the base member 140 may release the load from the lower member 120, causing the lower member 120 to transition from the loaded state to the unloaded state.

The upper side 141 of the base member 140 may have a post 143 extending upward therefrom. The post 143 may have a cylindrical shape. The post 143 may have a free end 144 distal from the upper side 141 of the base member 140. The free end 144 may have a spherical shape 145. The spherical shape 145 may have a diameter greater than a diameter of the post 143. The free end 144 may be other shapes, such as a canoe sphere, sphero-cylinder, or other kinematic/semi-kinematic features.

The lower side 122 of the lower member 120 may comprise an opening 126. When the base member 140 is coupled to the lower member 120, the free end 144 of the post 143 may be received in the opening 126.

The opening 126 may comprise a first portion 127 and a second portion 128. The first portion 127 may have a width greater than the diameter of the spherical shape 145. The second portion 128 may have a width greater than the diameter of the post 143 and less than the diameter of the spherical shape 145. When the base member 140 is coupled to the lower member 120, the free end 144 of the post 143 may be received in the first portion 127 and the post 143 may be at least partially received in the second portion 128.

The lower member 120 may further comprise a pair of internal abutment faces 129 inside the opening 126. The pair of internal abutment faces 129 may be defined by tapered surfaces connecting the first portion 127 of the opening 126 to the second portion 128 of the opening 126. The pair of internal abutment faces 129 may be planar or curved. When the base member 140 is coupled to the lower member 120, the spherical shape 145 may contact the pair of internal abutment faces 129. For example, the spherical shape 145 may contact one point on each internal abutment face 129. The tapered profile of the pair of internal abutment faces 129 may cause self-centering when the base member 140 is coupled to the lower member 120. For example, if the coupling is at first misaligned (i.e., the spherical shape 145 contacts only one of the pair of internal abutment faces 129 as shown in FIG. 1B), the tapered profile may allow the spherical shape 145 to slide into a centered position (shown in FIG. 1C), where there is contact with both internal abutment faces 129, before transitioning into the loaded state.

The apparatus 100 may further comprise a bellows 150. The bellows 150 may be disposed between the upper member 110 and the lower member 120. The bellows 150 may have an upper end 151 connected to the upper member 110 and a lower end 152 connected to the lower member 120. For example, the upper end 151 of the bellows 150 may be connected to the lower side 112 of the upper member 110, and the lower end 152 of the bellows 150 may be connected to the upper side 121 of the lower member 120. The bellows 150 may be connected to the upper member 110 and the lower member 120 by welds. The bellows 150 may surround the spring 130. For example, an inner diameter of the bellows 150 may be greater than an outer diameter of the spring 130. The bellows 150 may be configured to hermetically seal an interior of the bellows 150 from an exterior of the bellows 150. For example, particles generated by movement of the spring 130 and contact between the pin 113 and seat 123 may be contained inside the bellows 150, so as not to contaminate the clean air outside of the bellows 150. The bellows 150 may be made of a resilient material. For example, the bellows 150 may be a flexible corrugated element. The bellows 150 may have horizontal corrugations to permit axial deformation. The bellows 150 may be elastically deformable by a length greater than or equal to the length of the gap 124, and may have a sufficient fatigue life for repeated deformation within this range. In this way, the bellows 150 may maintain a hermetic seal between the upper member 110 and the lower member 120 in both the loaded state and the unloaded state. The bellows 150 may also be strong enough to withstand a pressure differential between the exterior of the bellows 150 and the interior of the bellows 150. It should be understood that the apparatus 100 may be disposed in a vacuum chamber, and the bellows 150 may be able to maintain a hermetic seal between the upper member 110 and the lower member 120 during fluctuations in pressure within the vacuum chamber.

According to an embodiment of the present disclosure, the apparatus 100 may include a multiplicity of the components described above. For example, the apparatus 100 may include three or more of certain components, as further described below. Reference is made to the apparatus 101 in FIGS. 3A and 3B, and the individual components of FIGS. 4-8.

Figure 4:
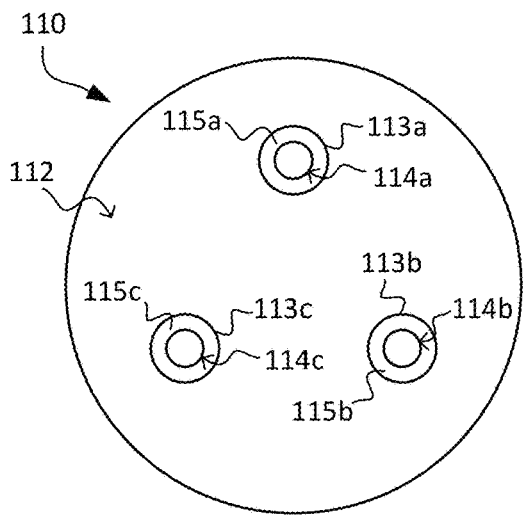
FIG. 4 is a bottom view of an upper member of the apparatus of FIG. 3A.

The lower side 112 of the upper member 110 may have at least three pins 113 extending downward therefrom. For example, as shown in FIG. 4, the at least three pins 113 may include a first pin 113a, a second pin 113b, and a third pin 113c. The at least three pins 113 may be equally spaced apart on the lower side 112 of the upper member 110. For example, the first pin 113a, the second pin 113b, and the third pin 113c may be at three concyclic points on the lower side 112 of the upper member 110. Each of the at least three pins 113 may have identical structure. The free end 114 of each of the at least three pins 113 may have a beveled edge 115. For example, the free end 114a of the first pin 113a may have a first beveled edge 115a, the free end 114b of the second pin 113b may have a second beveled edge 115b, and the free end 114c of the third pin 113c may have a third beveled edge 115c.

Figure 5A:
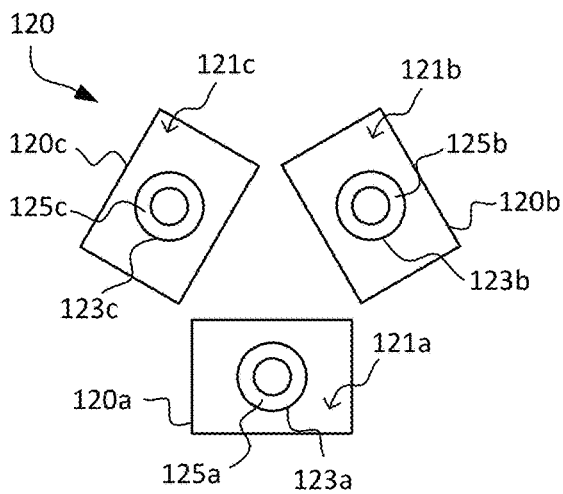
FIG. 5A is a top view of three lower members of the apparatus of FIG. 3A.

The lower member 120 may comprise at least three lower members. For example, as shown in FIG. 5A, the lower member 120 may include a first lower member 120a, a second lower member 120b, and a third lower member 120c, having a first seat 123a, a second seat 123b, and a third seat 123c and upper sides 121a, 121b, and 121c, respectively. Each of the at least three lower members 120 may have identical structure. The seat 123 of each lower member 120 may be configured to receive the free end 114 of one of the at least three pins 113. For example, the first seat 123a may be configured to receive a free end 114a of the first pin 113a, the second seat 123b may be configured to receive a free end 114b of the second pin 113b, and the third seat 123c may be configured to receive a free end 114c of the third pin 113c. Each seat 123 of the at least three lower members 120 may comprise a countersunk hole 125. For example, the first seat 123a of the first lower member 120a may comprise a first countersink 125a, the second seat 123b of the second lower member 120b may comprise a second countersink 125b, and the third seat 123c of the third lower member 120c may comprise a third countersink 125c. The at least three lower members 120 may be arranged with radial symmetry. For example, the first lower member 120a, the second lower member 120b, and the third lower member 120c may be arranged 120 degrees relative to each other.

Figure 6:
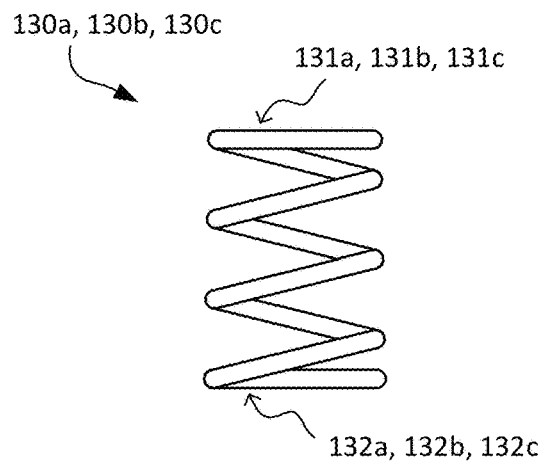
FIG. 6 is a side view of a spring of the apparatus of FIG. 3A.

The spring 130 may comprise at least three springs. For example, the spring 130 may include a first spring 130a, a second spring 130b, and a third spring 130c. As shown in FIG. 6, the first spring 130a, the second spring 130b, and the third spring 130c may be identical. Each of the at least three springs 130 may be disposed between the upper member 110 and a respective one of the at least three lower members 120. For example, an upper end 131a of the first spring 130a, an upper end 131b of the second spring 130b, and an upper end 131c of the third spring 130c may each be connected to the upper member 110. A lower end 132a of the first spring 130a, a lower end 132b of the second spring 130b, and a lower end 132c of the third spring 130c may be connected to the first lower member 120a, the second lower member 120b, and the third lower member 120c, respectively. Each of the at least three springs 130 may surround one of the at least three pins 113. For example, the first spring 130a may surround the first pin 113a, the second spring 130b may surround the second pin 113b, and the third spring 130c may surround the third pin 113c.

Figure 7:
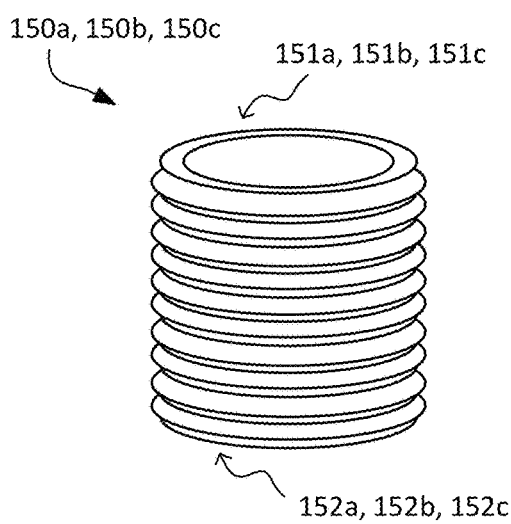
FIG. 7 is a perspective view of a bellows of the apparatus of FIG. 3A.

The bellows 150 may comprise at least three bellows. For example, the bellows 150 may comprise a first bellows 150a, a second bellows 150b, and a third bellows 150c. As shown in FIG. 7, the first bellows 150a, the second bellows 150b, and the third bellows 150c may be identical. Each of the at least three bellows 150 may be disposed between the upper member 110 and a respective one of the at least three lower members 120. For example, an upper end 151a of the first bellows 150a, an upper end 151b of the second bellows 150b, and an upper end 151c of the third bellows 150c may each be connected to the upper member 110. A lower end 152a of the first bellows 150a, a lower end 152b of the second bellows 150b, and a lower end 152c of the third bellows 150c may be connected to the first lower member 120a, the second lower member 120b, and the third lower member 120c, respectively. Each of the at least three bellows 350 may surround one of the at least three springs 130. For example, the first bellows 150a may surround the first spring 130a, the second bellows 150b may surround the second spring 130b, and the third bellows 150c may surround the third bellows 150c.

Figure 3A:
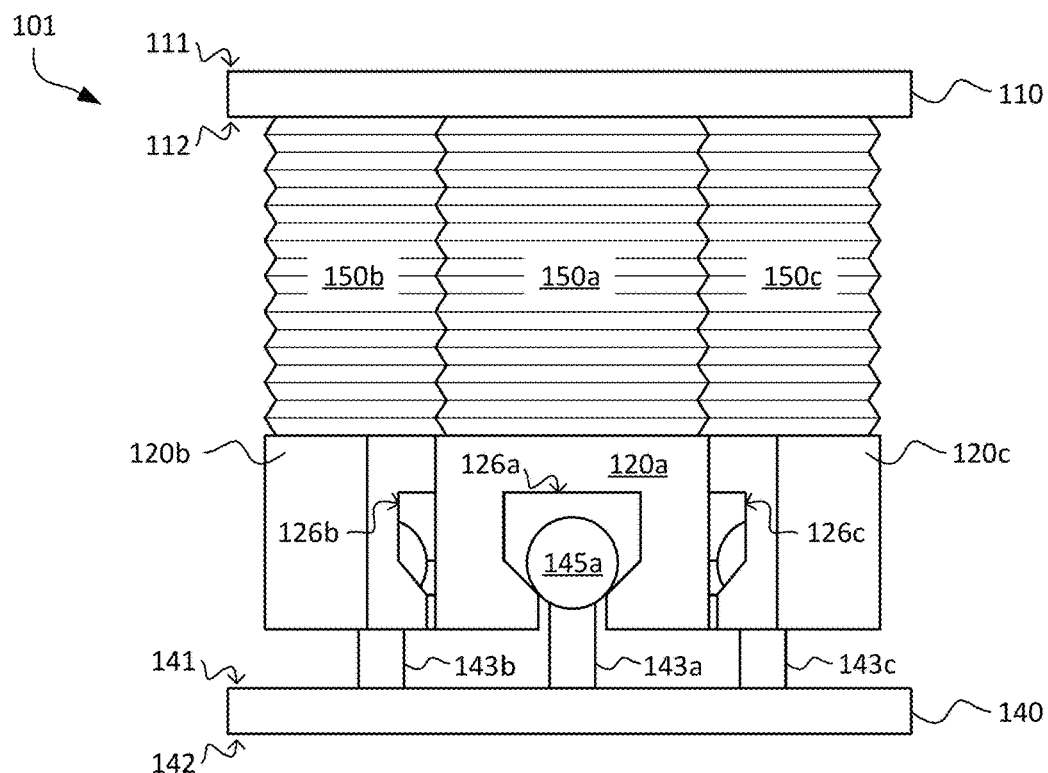
FIG. 3A is a front view of an apparatus according to another embodiment of the present disclosure.
Figure 8:
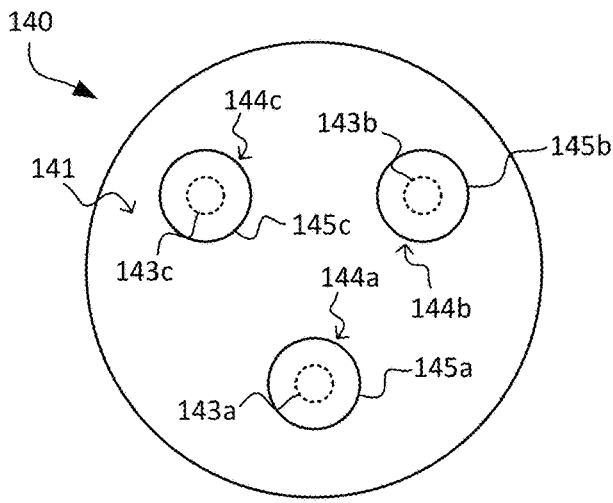
FIG. 8 is a top view of a base member of the apparatus of FIG. 3A.

The upper side 141 of the base member 140 may have at least three posts 143 extending upward therefrom. For example, as shown in FIG. 3A, the at least three posts 143 may include a first post 143a, a second post 143b, and a third post 143c. The at least three posts 143 may be equally spaced apart on the upper side 141 of the base member 140. For example, the first post 143a, the second post 143b, and the third post 143c may be at three concyclic points on the upper side 141 of the base member 140. Each of the at least three posts 143 may have identical structure. A free end 144 of each of the at least three posts 143 may have a spherical shape 145 with a diameter greater than a diameter of the post 143. For example, as shown in FIG. 8, the free end 144a of the first post 143a may have a first spherical shape 145a, the free end 144b of the second post 143b may have a second spherical shape 145b, and the free end 144c of the third post 143c may have a third spherical shape 145c.

Figure 3B:
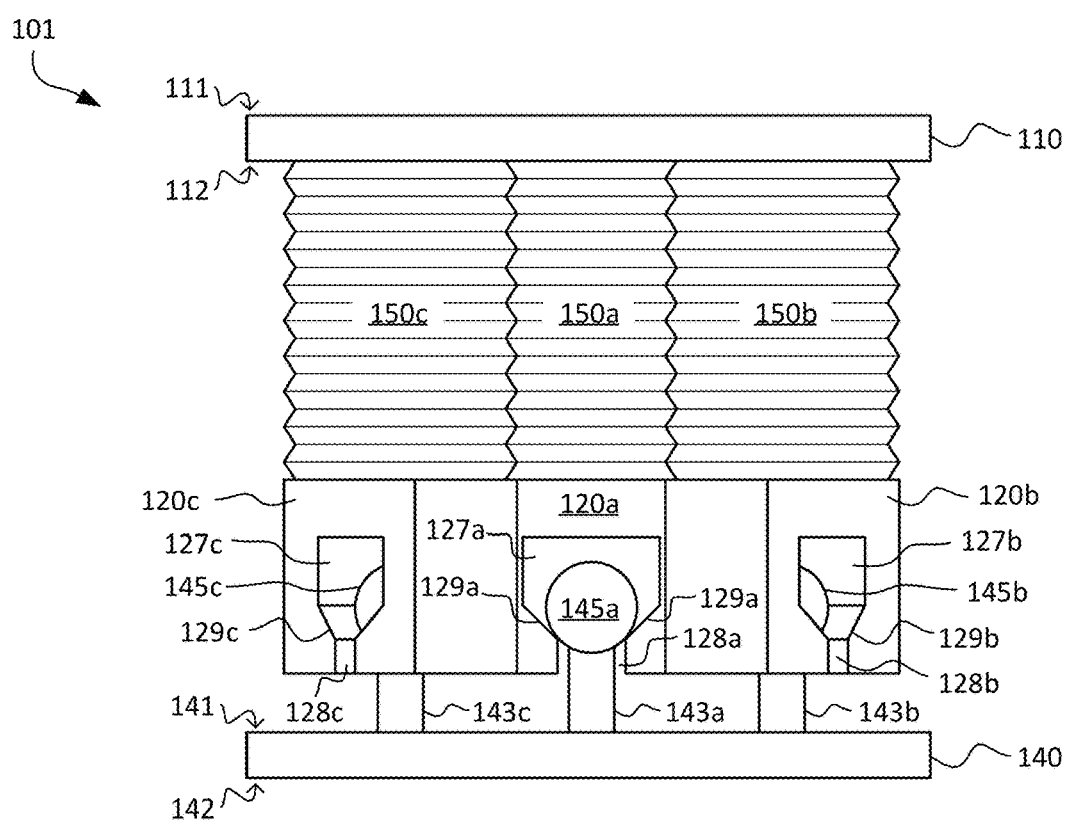
FIG. 3B is a rear view of the apparatus of FIG. 3A.

The base member 140 may be configured to be coupled to each of the lower members 120. For example, as shown in FIG. 3B, the first post 143a, the second post 143b, and the third post 143c may be configured to be coupled to the first lower member 120a, the second lower member 120b, and the third lower member 120c, respectively. When the base member 140 is coupled to each of the lower members 120, the base member 140 applies the load to each of the lower members 120, causing each of the lower members 120 to transition from the unloaded state to the loaded state. When the base member 140 is uncoupled from each of the lower members 120, the base member 140 releases the load from each of the lower members 120, causing each of the lower members 120 to transition from the loaded state to the unloaded state.

Figure 5B:
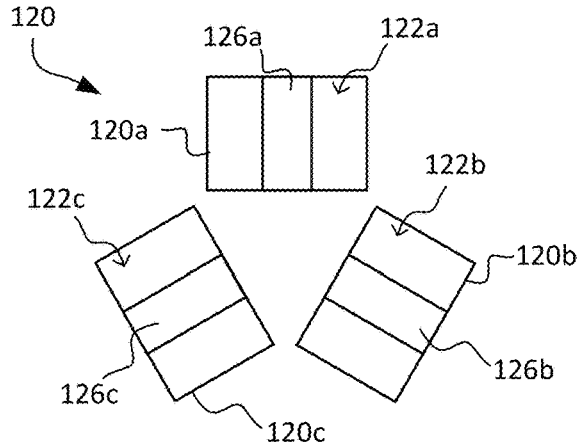
FIG. 5B is a bottom view of three lower members of the apparatus of FIG. 3A.

The lower side 122 of each of the lower members 120 may comprise an opening 126. For example, as shown in FIG. 5B, the lower side 122a of the first lower member 120a may comprise a first opening 126a, the lower side 122b of the second lower member 120b may comprise a second opening 126b, and the lower side 122c of the third lower member 120c may comprise a third opening 126c. When the base member 140 is coupled to each of the lower members 120, the free ends 144 of each of the posts 143 are received in the openings 126. For example, the free end 144a of the first post 143a may be received in the first opening 126a, the free end 144b of the second post 143b may be received in the second opening 126b, and the free end 144c of the third post 143c may be received in the third opening 126c. The free ends 144 of each of the posts 143 may be received simultaneously or sequentially in the openings 126. The base member 140 may rotated in order for the free ends 144 of each of the posts 143 to be received in the respective openings 126.

The opening 126 of each of the lower members 120 may comprise a first portion 127 and a second portion 128. For example, as shown in FIG. 3B, the first opening 126a of the first lower member 120a may have a first portion 127a and a second portion 128a, the second opening 126b of the second lower member 120b may have a first portion 127b and a second portion 128b, and the third opening 126c of the third lower member 120c may have a first portion 127c and a second portion 128c. When the base member 140 is coupled to the lower member 120, the free end 144 of the post 143 may be received in the first portion 127 and the post 143 may be at least partially received in the second portion 128.

Each lower member 120 may further comprise a pair of internal abutment faces 129 inside the opening 126. For example, as shown in FIG. 3B, the first opening 126a of the first lower member 120a may have first abutment faces 129a, the second opening 126b of the second lower member 120b may have second abutment faces 129b, and the third opening 126c of the third lower member 120c may have third abutment faces 129c. Each pair of internal abutment faces 129 may be defined by tapered surfaces connecting the first portion 127 of the opening 126 to the second portion 128 of the opening 126. Each pair of internal abutment faces 129 may be planar or curved. When the base member 140 is coupled to the lower member 120, the spherical shape 145 may contact the pair of internal abutment faces 129. For example, the spherical shape 145 may contact one point on each internal abutment face 129. The first spherical shape 145a may contact the first abutment faces 129a, the second spherical shape 145b may contact the second abutment faces 129b, and the third spherical shape 145c may contact the third abutment faces 129c.

In some embodiments, the shape of the free ends 144 of each post 143 and the number of internal abutment faces 129 may be the same or may vary. For example, each opening 126 may have a pair of internal abutment faces 129 (e.g., a vee shape), each providing two contact points with the free end 144 of each post 143. Alternatively, an opening 126 may have a single internal abutment face 129 (e.g., a flat shape) providing one contact point with the free end 144 of a post 143, or an opening 126 may have three internal abutment faces 129 (e.g., a cone shape) providing three contact points with the free end 144 of a post 143. The free ends 144 of each post 143 may have a spherical, cone, or flat shape to contact the corresponding internal abutment faces 129. In an embodiment, the apparatus 100 may have a combination of the above shapes. For example, one opening 126 may have a vee shape, one opening 126 may have a flat shape, and one opening 126 may have a cone shape. In this arrangement, the openings 126 may be parallel, such that the free ends 144 of each post 143 may be received simultaneously in each opening 126.

It should be understood that while the apparatus 100 is described as having one or three of various components, the number of these components may vary based on the particular application of the apparatus 100, where self-centering of an assembly mounted on a compliant structure may be desired. In order to constrain all six degrees of freedom, six contact points may be needed between the base member 140 and the lower member 120. For example, six assemblies may be used where each assembly provides a single contact point, or three assemblies may be used where each assembly provides two contact points.

With the apparatus 100 of the present disclosure, no manual action may be needed to transition from a rigid state to a compliant state, because the coupling load itself causes the transition to occur. This may allow repeatable centered seating of the assembly. In addition, any particles created from engagement/disengagement of the internal mechanism or chemical contamination from any lubricants used may be trapped within the body of the apparatus 100, so as not to contaminate the clean exterior environment.

Figure 9:
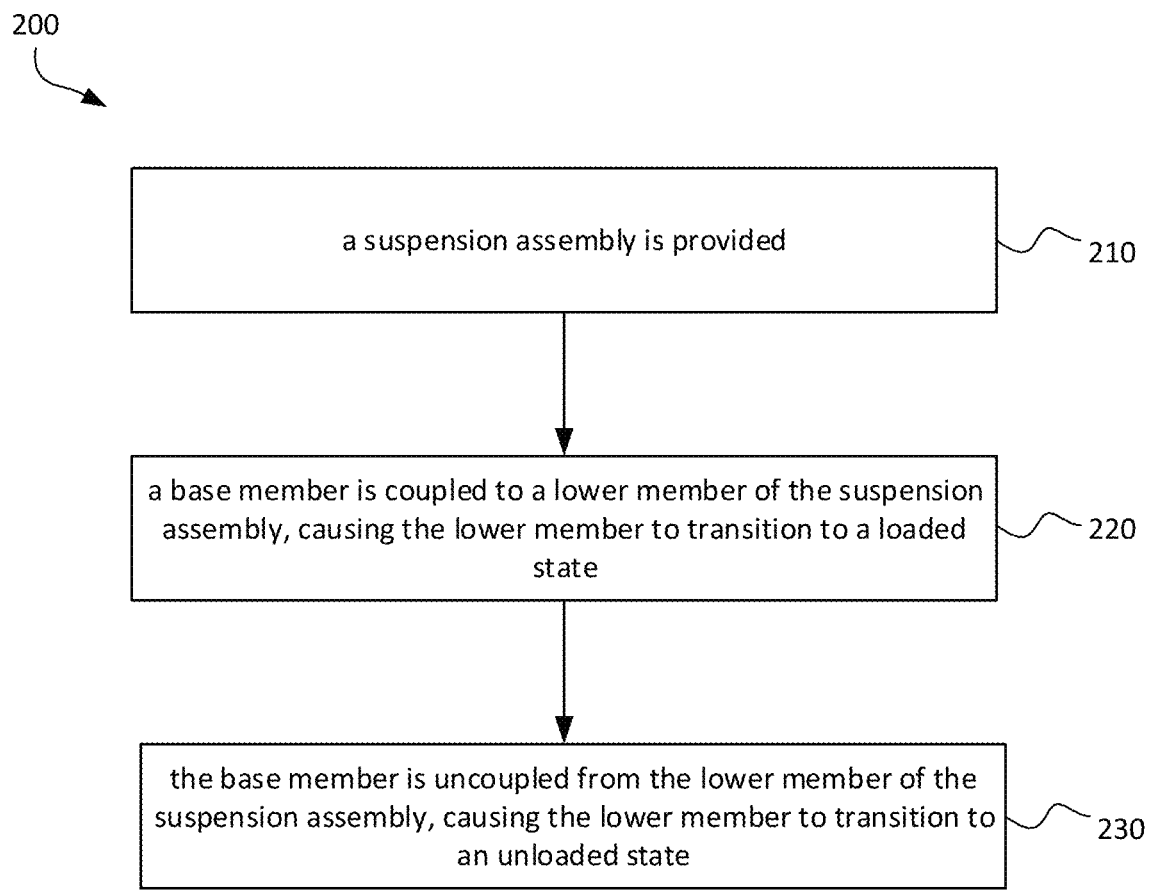
FIG. 9 is a flow chart of a method according to an embodiment of the present disclosure.

Referring to FIG. 9, an embodiment of the present disclosure provides method 200. The method 200 may comprise the following steps.

At step 210, a suspension assembly is provided. The suspension assembly may comprise components of the apparatus 100 described above in connection with FIGS. 1-8 or other embodiments disclosed herein. The suspension assembly may comprise an upper member. The upper member may have an upper side and a lower side. The upper side of the upper member may be a fixed constraint. The lower side of the upper member may have a pin extending downward therefrom. The pin may have a cylindrical shape. The pin may have a free end distal from the lower side of the upper member. The upper member may have a circular or polygonal shape.

The suspension assembly may further comprise a lower member. The lower member may be disposed beneath the upper member. For example, the lower member may be spaced apart from the upper member in the vertical direction. The lower member and the upper member may be coaxially aligned. The lower member may have a circular or polygonal shape. For example, the lower member and the upper member may have the same shape. The lower member may have an upper side and a lower side. The upper side of the lower member may have a seat configured to receive the free end of the pin. The lower member may be configured to carry a load in a loaded state and release the load in an unloaded state.

The suspension assembly may further comprise a spring. The spring may be disposed between the upper member and the lower member. The spring may have an upper end connected to the upper member and a lower end connected to the lower member. For example, the upper end of the spring may be connected to the lower side of the upper member, and the lower end of the spring may be connected to the upper side of the lower member. The spring may surround the pin. For example, the spring may have an inner diameter that is greater than the diameter of the pin. The spring may have a free length (i.e., an unloaded length) that is less than the length of the pin.

In the unloaded state, the free end of the pin contacts the seat and the spring applies a compressive force to prevent relative lateral movement between the upper member and the lower member. In the loaded state, the load applies a tensile force to the spring that forms a gap between the free end of the pin and the seat, which allows relative lateral movement between the upper member and the lower member.

At step 220, a base member is coupled to the lower member beneath the suspension assembly. The base member may have a circular shape. The base member may have an upper side and a lower side. The upper side of the base member may be configured to couple to the lower side of the lower member. The base member may apply the load to the lower member, causing the lower member to transition from the unloaded state to the loaded state.

According to an embodiment of the present disclosure, the method 200 may further comprise step 230. At step 230, the base member is uncoupled from the lower member of the suspension assembly. The base member may release the load from the lower member, causing the lower member to transition from the loaded state to the unloaded state.

With the method 200 of the present disclosure, no manual action may be needed to transition from a rigid state to a compliant state, because the load itself, applied by the coupling of the base member to the lower member, causes the transition to occur. Simply uncoupling the base member from the lower member may cause the assembly to transition back to the rigid state. This may allow repeatable centered seating of the assembly.

Figure 10A:
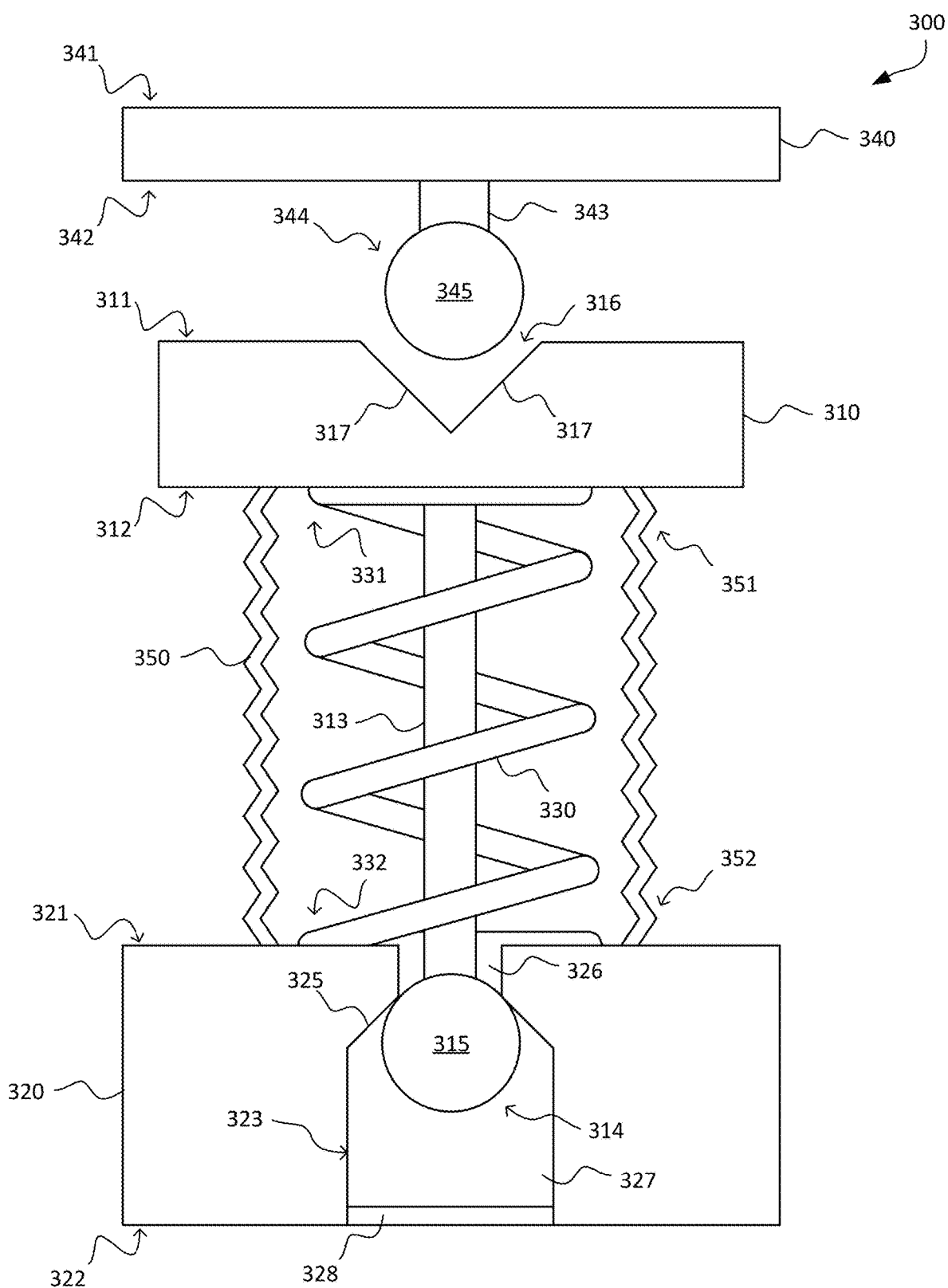
FIG. 10A is a cross-sectional view of an apparatus in an unloaded state according to another embodiment of the present disclosure.
Figure 10B:
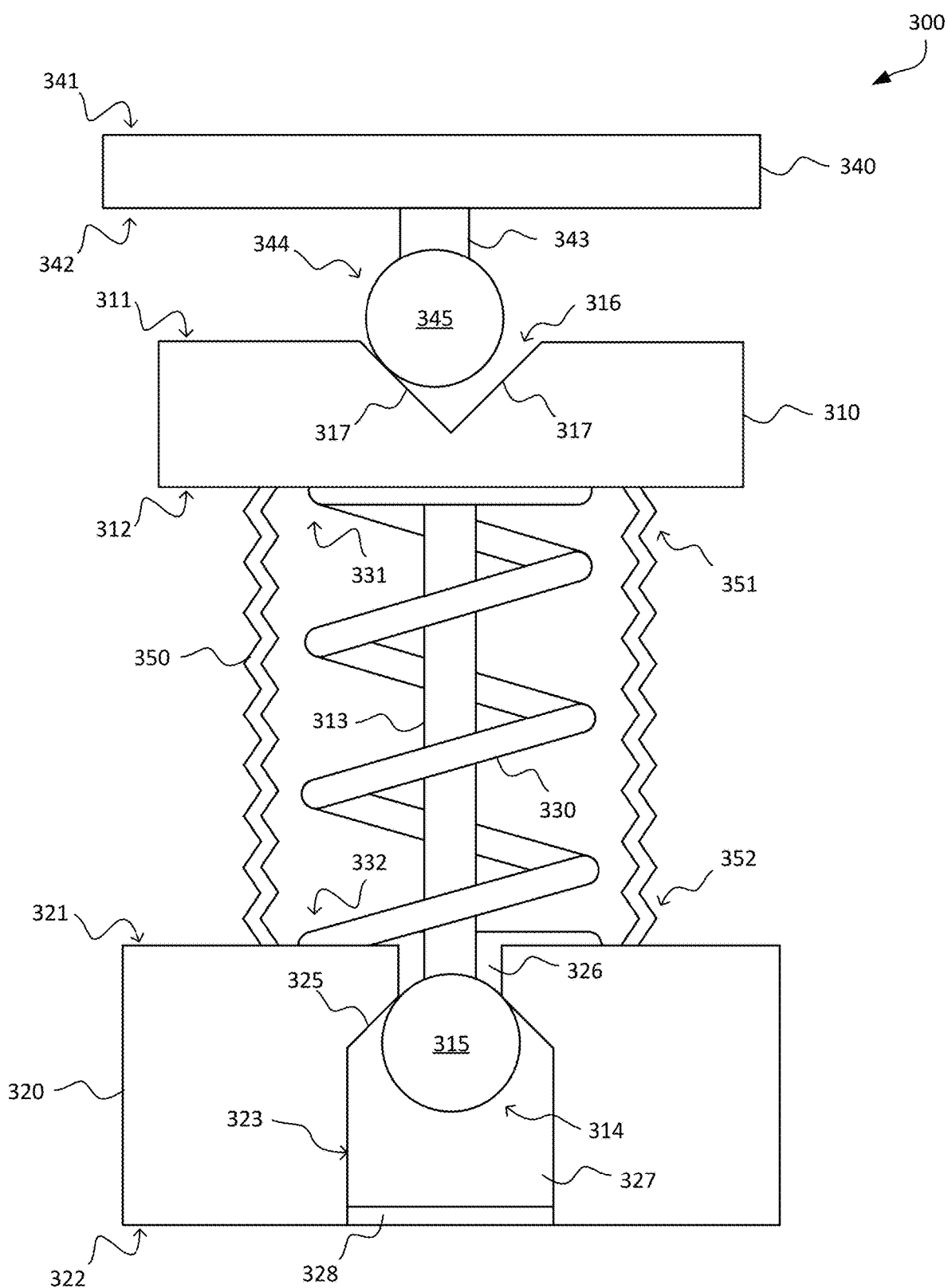
FIG. 10B is a cross-sectional view of the apparatus of FIG. 10A in a misaligned state.
Figure 10C:
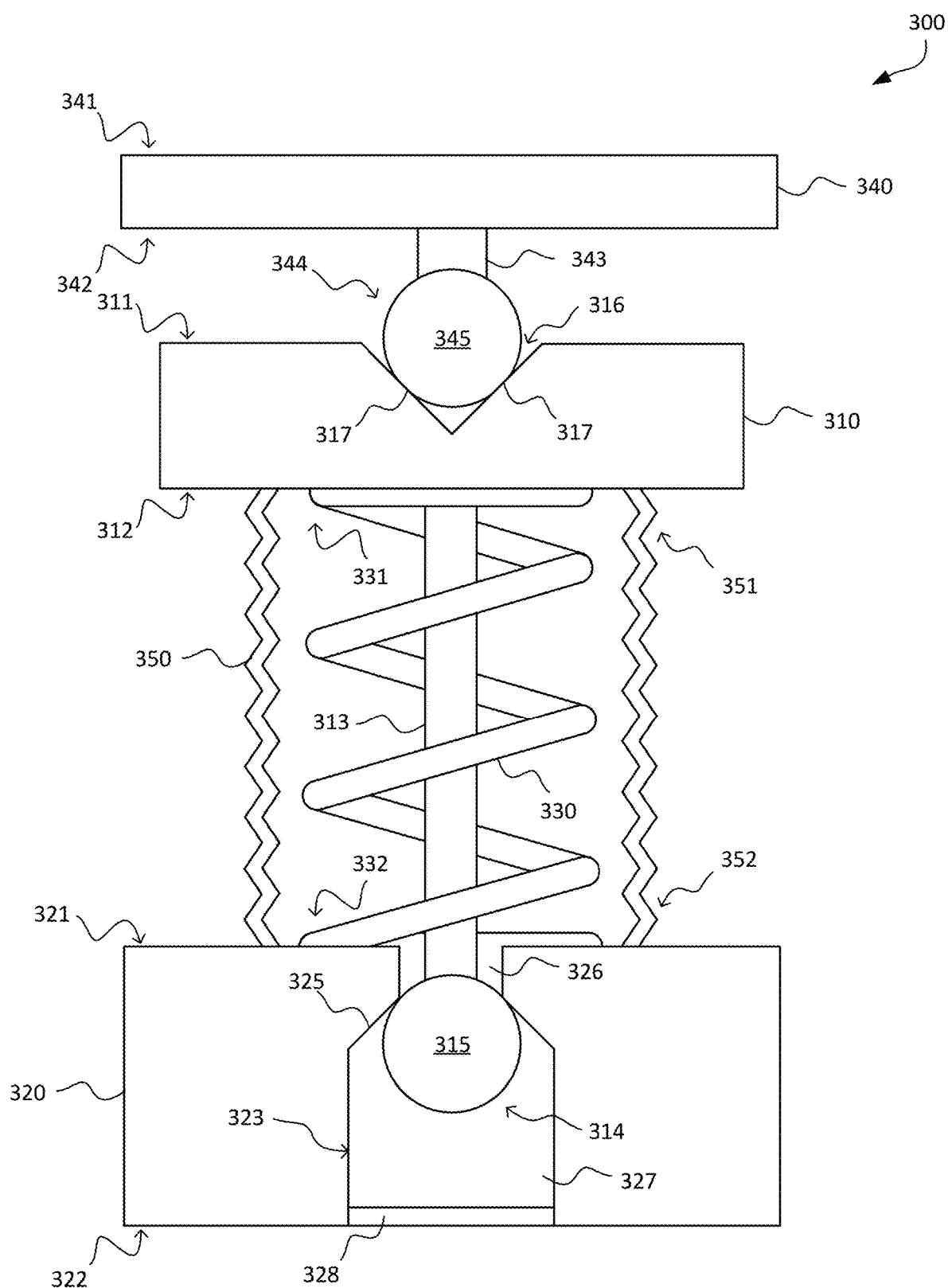
FIG. 10C is a cross-sectional view of the apparatus of FIG. 10A in a centered state.
Figure 11:
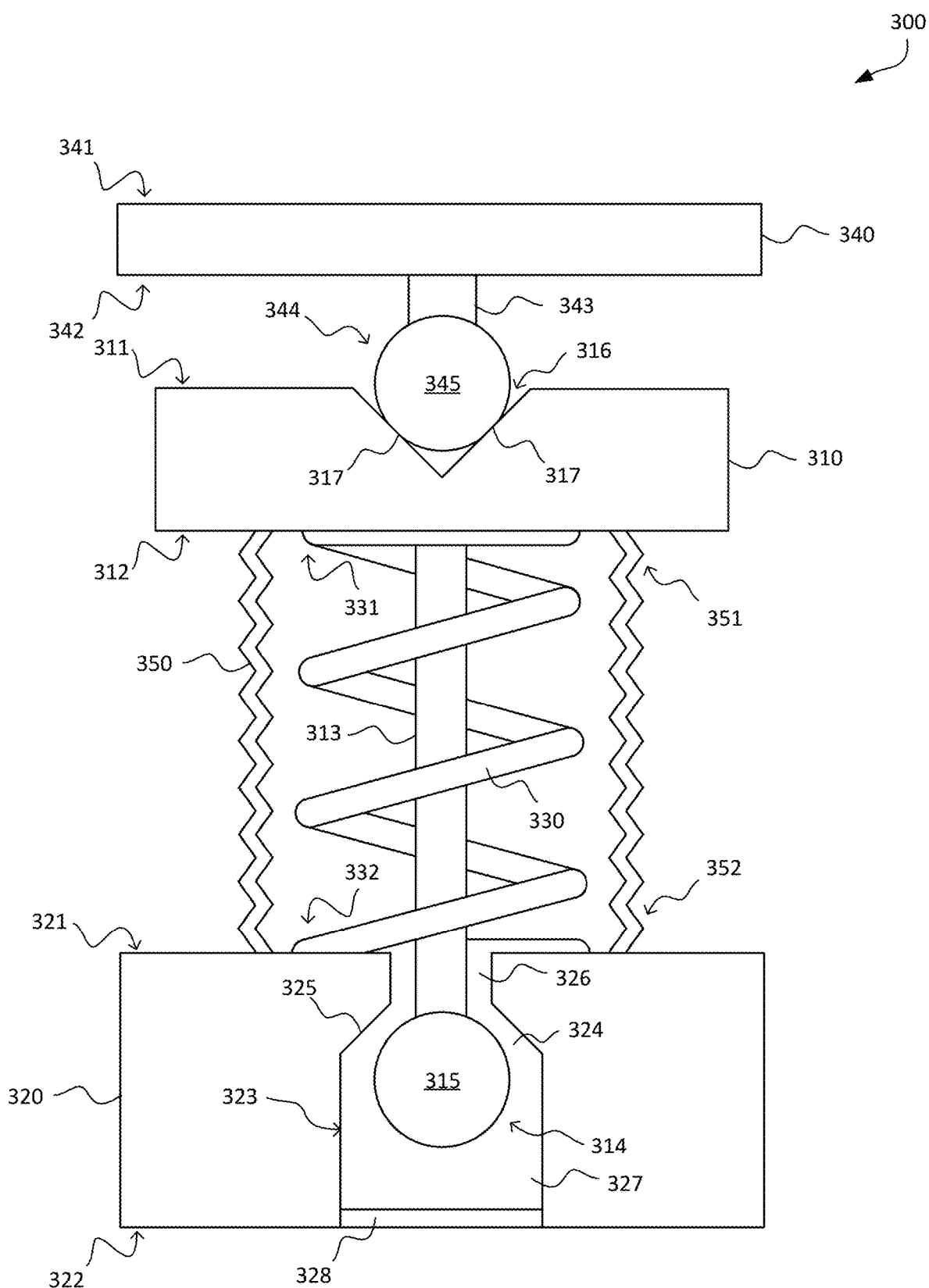
FIG. 11 is a cross-sectional view of the apparatus of FIG. 10A in a loaded state.

Referring to FIGS. 10-11, an embodiment of the present disclosure provides an apparatus 300. The apparatus 300 may be similar to the apparatus 100 described above, and may comprise similar components to those of apparatus 100 described above. The apparatus 300 differs from the apparatus 100 in that the apparatus 300 may provide a compression suspension, while the apparatus 100 may provide an extension suspension.

The apparatus 300 may comprise an upper member 310. The upper member 310 may have an upper side 311 and a lower side 312. The lower side 312 of the upper member 310 may have a pin 313 extending downward therefrom. The pin 313 may have a cylindrical shape. The pin 313 may have a free end 314 distal from the lower side 312 of the upper member 310. The free end 314 of the pin 313 may have a collar 315. The collar 315 may have a spherical or cylindrical shape. The diameter of the collar 315 may be greater than the diameter of the pin 313. The upper member 310 may have a circular or polygonal shape. The upper member 310 may be configured to carry a load in a loaded state and release the load in an unloaded state.

The apparatus 300 may further comprise a lower member 320. The lower member 320 may be disposed beneath the upper member 310. For example, the lower member 120 may be spaced apart from the upper member 310 in the vertical direction. The lower member 320 and the upper member 310 may be coaxially aligned. The lower member 320 may have a circular or polygonal shape. The lower member 320 may be a fixed constraint. The lower member 320 may have an upper side 321 and a lower side 322. The upper side 321 of the lower member 320 may have a seat 323 configured to receive the free end 314 of the pin 313.

The apparatus 300 may further comprise a spring 330. The spring 330 may be a coil spring. The spring 330 may be disposed between the upper member 310 and the lower member 320. The spring 330 may have an upper end 331 connected to the upper member 310 and a lower end 332 connected to the lower member 320. For example, the upper end 331 of the spring 330 may be connected to the lower side 312 of the upper member 310, and the lower end 332 of the spring 330 may be connected to the upper side 321 of the lower member 320. The spring 330 may be connected to the upper member 310 and the lower member 320 by fasteners or welds. Alternatively, the spring 330 may be integrally formed with the upper member 310 and the lower member 320. The spring 330 may surround the pin 313. For example, the spring 330 may have an inner diameter that is greater than the diameter of the pin 313. The spring 330 may have a free length (i.e., an unloaded length) that is greater than the length of the pin 313. The free length of the spring 330 and the length of the pin 313 may be set by design. For example, the free length of the spring 330 and the length of the pin 313 may depend on a combination of other parameters of the spring 330 (e.g., spring constant) and the pin 313 (e.g., diameter), to prevent the pin 313 or the lower member 320 from breaking under the force of the spring 330 in the unloaded state.

In the unloaded state shown in FIG. 10A, the free end 314 of the pin 313 contacts the seat 323, and the spring 330 applies a tensile force to prevent relative lateral movement between the upper member 310 and the lower member 320. Accordingly, the apparatus 300 may be rigid to facilitate loading. The seat 323 may comprise a countersunk hole 325. In the unloaded state, the free end 314 of the pin 313 may be received in the seat 323 with an annular contact surface between the collar 315 of the pin 313 and the countersunk hole 325 of the seat 323.

In the loaded state shown in FIG. 11, the load applies a compressive force to the spring 330 that forms a gap 324 between the free end 314 of the pin 313 and the seat 323, which allows relative lateral movement between the upper member 310 and the lower member 320. Accordingly, the apparatus 300 may be compliant to absorb vibration when loaded. It should be understood that the size of the gap 324 may depend on the geometry of the interface between the pin 313 and the seat 323, in order to be large enough to accommodate any relative motion between the upper member 310 and the lower member 320.

In the loaded state, the free end 314 of the pin 313 may be still received in the seat 323. For example, the seat 323 may comprise a first portion 326 and a second portion 327. The first portion 326 may have a diameter that is greater than the diameter of the pin 313 and less than the diameter of the collar 315. The second portion 327 may have a diameter that is greater than the diameter of the collar 315. Thus, the pin 313 may be received in the first portion 326, and the free end 314 of the pin 313 may be received in the second portion 327. In this way, the free end 314 of the pin 313 may move downward in the second portion 327 of the seat 323 in the loaded state. The seat 323 may further comprise a plug 328 disposed in the second portion 327 of the seat 323. The plug 328 may hermetically seal the interior of the seat 323 from the exterior of the lower member 320.

The apparatus 300 may further comprise a base member 340. The base member 340 may be configured to carry any sensitive assembly that may be carried in suspension. For example, the base member 340 may be configured to carry an imaging mirror assembly (IMA), illumination assembly, laser, interferometer, or other sensitive instrumentation or components. The base member 340 may be disposed on top of the upper member 310. The base member 340 may have a circular or polygonal shape. The base member 340 may have an upper side 341 and a lower side 342. The base member 340 may be configured to couple to the upper member 310. For example, the lower side 342 of the base member 340 may be configured to couple to the upper side 311 of the upper member 310.

When the base member 340 is coupled to the upper member 310 (as shown in FIG. 11), the base member 340 may apply the load to the upper member 310, causing the upper member 310 to transition from the unloaded state to the loaded state.

When the base member 340 is uncoupled from the upper member 310 (as shown in FIG. 10A), the base member 340 may release the load from the upper member 310, causing the upper member 310 to transition from the loaded state to the unloaded state.

The lower side 342 of the base member 340 may have a post 343 extending downward therefrom. The post 343 may have a cylindrical shape. The post 343 may have a free end 344 distal from the lower side 342 of the base member 340. The free end 344 may have a spherical shape 345. The spherical shape 345 may have a diameter greater than a diameter of the post 343. The free end 344 may be other shapes, such as a canoe sphere, sphero-cylinder, or other kinematic/semi-kinematic features.

The upper side 311 of the upper member 310 may comprise a groove 316. When the base member 340 is coupled to the upper member 310, the free end 344 of the post 343 may contact the groove 316.

The groove 316 may have a vee shape, and comprise a pair of abutment faces 317. The pair of abutment faces 317 may be planar or curved. When the base member 340 is coupled to the upper member 310, the spherical shape 345 may contact the pair of abutment faces 317. For example, the spherical shape 345 may contact one point on each abutment face 317. The tapered profile of the pair of abutment faces 317 may cause self-centering when the base member 340 is coupled to the upper member 310. For example, if the coupling is at first misaligned (i.e., the spherical shape 345 contacts only one of the pair of abutment faces 317 as shown in FIG. 10B), the tapered profile may allow the spherical shape 345 to slide into a centered position (shown in FIG. 10C), where there is contact with both abutment faces 317, before transitioning into the loaded state.

The apparatus 300 may further comprise a bellows 350. The bellows 350 may be disposed between the upper member 310 and the lower member 320. The bellows 350 may have an upper end 351 connected to the upper member 310 and a lower end 352 connected to the lower member 320. For example, the upper end 351 of the bellows 350 may be connected to the lower side 312 of the upper member 310, and the lower end 352 of the bellows 350 may be connected to the upper side 321 of the lower member 320. The bellows 350 may be connected to the upper member 310 and the lower member 320 by welds. The bellows 350 may surround the spring 330. For example, an inner diameter of the bellows 350 may be greater than an outer diameter of the spring 330. The bellows 350 may be configured to hermetically seal an interior of the bellows 350 from an exterior of the bellows 350. For example, particles generated by movement of the spring 330 and contact between the pin 313 and seat 323 may be contained inside the bellows 350, so as not to contaminate the clean air outside of the bellows 350. The bellows 350 may be made of a resilient material. For example, the bellows 350 may be a flexible corrugated element. The bellows 350 may have horizontal corrugations to permit axial deformation. The bellows 350 may be elastically deformable by a length greater than or equal to the length of the gap 324, and may have a sufficient fatigue life for repeated deformation within this range. In this way, the bellows 350 may maintain a hermetic seal between the upper member 310 and the lower member 320 in both the loaded state and the unloaded state. The bellows 350 may also be strong enough to withstand a pressure differential between the exterior of the bellows 350 and the interior of the bellows 350. It should be understood that the apparatus 300 may be disposed in a vacuum chamber, and the bellows 350 may be able to maintain a hermetic seal between the upper member 310 and the lower member 320 during fluctuations in pressure within the vacuum chamber.

According to an embodiment of the present disclosure, the apparatus 300 may include a multiplicity of the components described above. For example, the apparatus 300 may include three or more of certain components, as further described below. Reference is made to the apparatus 301 in FIGS. 12A and 12B, and the individual components of FIGS. 13-17.

Figure 13A:
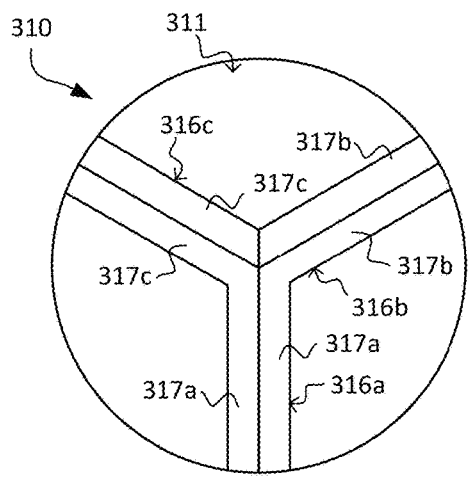
FIG. 13A is a top view of an upper member of the apparatus of FIG. 12A.
Figure 13B:
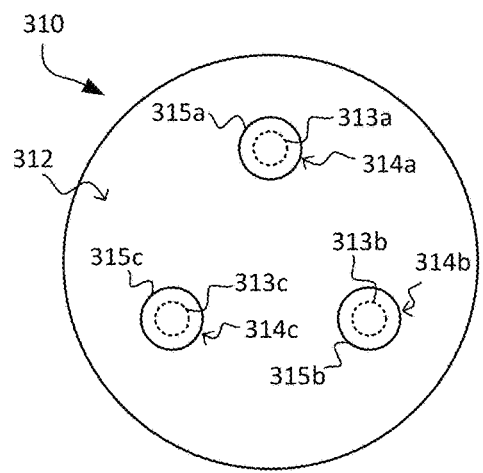
FIG. 13B is a bottom view of an upper member of the apparatus of FIG. 12A.

The lower side 312 of the upper member 310 may have at least three pins 313 extending downward therefrom. For example, as shown in FIG. 13B, the at least three pins 313 may include a first pin 313a, a second pin 313b, and a third pin 313c. The at least three pins 313 may be equally spaced apart on the lower side 312 of the upper member 310. For example, the first pin 313a, the second pin 313b, and the third pin 313c may be at three concyclic points on the lower side 312 of the upper member 310. Each of the at least three pins 313 may have identical structure. The free end 314 of each of the at least three pins 313 may have a collar 315. For example, the free end 314a of the first pin 313a may have a first collar 315a, the free end 314b of the second pin 313b may have a second collar 315b, and the free end 314c of the third pin 313c may have a third collar 315c. A diameter of the collar 315 of each of the at least three pins 313 may be greater than the diameter of each pin 313.

Figure 14A:
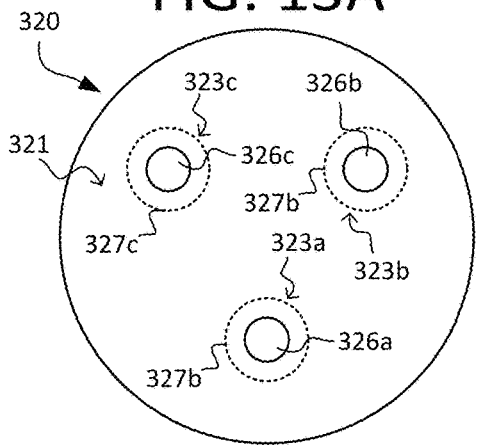
FIG. 14A is a top view of a lower member of the apparatus of FIG. 12A.

The lower member 320 may comprise at least three seats 323. For example, the lower member 320 may comprise a first seat 323a, a second seat 323b, and a third seat 323c that can form the gaps 324a, 324b, and 324c, respectively. Each seat 323 may be configured to receive the free end 314 of one of the at least three pins 313. For example, the first seat 323a may be configured to receive a free end 314a of the first pin 313a, the second seat 323b may be configured to receive a free end 314b of the second pin 313b, and the third seat 323c may be configured to receive a free end 314c of the third pin 313c. Each of the at least three seats 323 may comprise a countersunk hole 325. For example, the first seat 323a may comprise a first countersink 325a, the second seat 323b may comprise a second countersink 325b, and the third seat 323c may comprise a third countersink 325c. The at least three seats 323 may be at three concyclic points extending from the upper side 321 to the lower side 322 of the lower member 320. For example, as shown in FIG. 14A, the first seat 323a, the second seat 323b, and the third seat 323c may be arranged 120 degrees relative to each other.

Figure 12A:
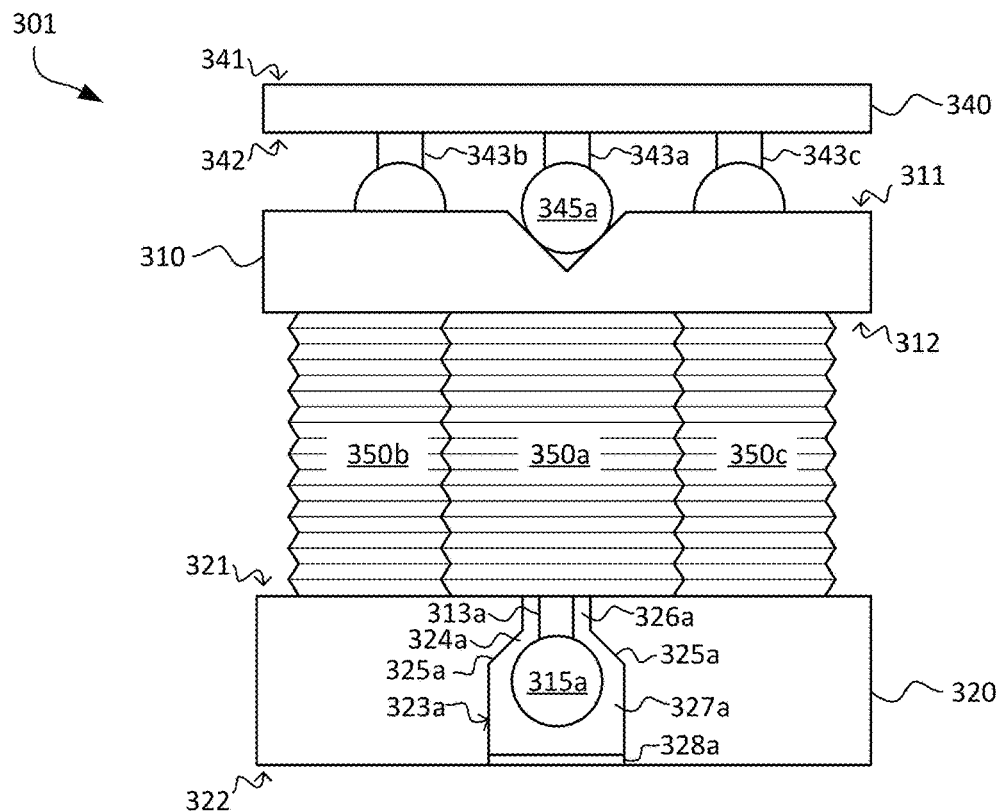
FIG. 12A is a front view of an apparatus according to another embodiment of the present disclosure.
Figure 12B:
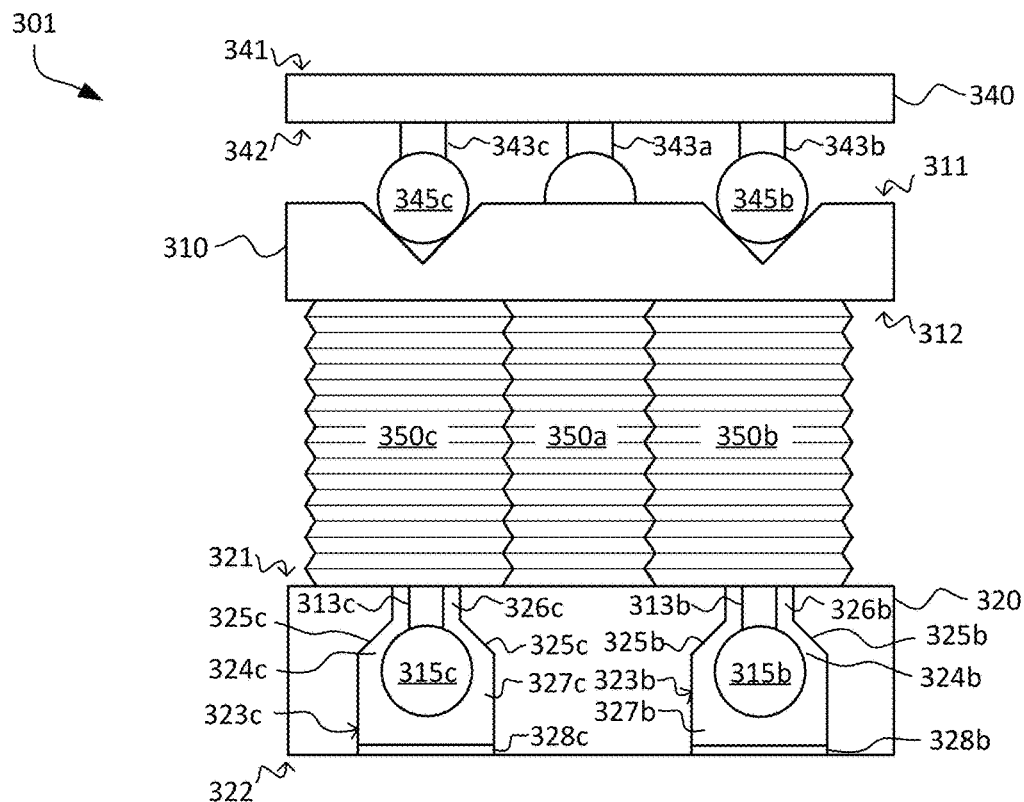
FIG. 12B is a rear view of the apparatus of FIG. 12A.

Each of the at least three seats 323 may comprise a first portion 326 and a second portion 327. For example, as shown in FIGS. 12A and 12B, the first seat 323a may have a first portion 326a and a second portion 327a, the second seat 323b may have a first portion 326b and a second portion 327b, and the third seat 323c may have a first portion 326c and a second portion 327c. The pin 313 of one of the at least three pins 313 may be received in the second portion 327, and the free end 314 of one of the at least three pins 313 may be received in the second portion 327. For example, the first pin 313a may be received in the first portion 326a of the first seat 323a, the second pin 313b may be received in the first portion 326b of the second seat 323b, and the third pin 313c may be received in the first portion 326c of the third seat 323c. The free end 314a of the first pin 313a may be received in the second portion 327a of the first seat 323a, the free end 314b of the second pin 313b may be received in the second portion 327b of the second seat 323b, and the free end 314c of the third pin 313c may be received in the second portion 327c of the third seat 323c.

Figure 14B:
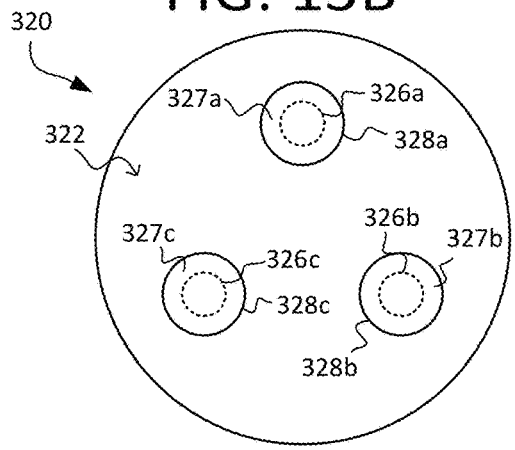
FIG. 14B is a bottom view of a lower member of the apparatus of FIG. 12A.

The lower member 320 may further comprise at least three plugs 328. The at least three plugs may be disposed in a respective one of the at least three seats 323 on the lower side 322 of the lower member 320. For example, as shown in FIG. 14B, a first plug 328a, a second plug 328b, and a third plug 328c, may be disposed in the first seat 323a, second seat 323b, and the third seat 323c, respectively.

Figure 15:
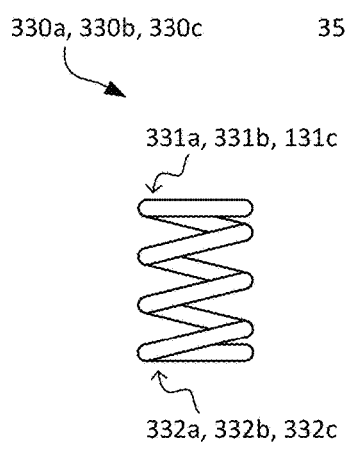
FIG. 15 is a side view of a spring of the apparatus of FIG. 12A.

The spring 330 may comprise at least three springs. For example, the spring 330 may include a first spring 330a, a second spring 330b, and a third spring 330c. As shown in FIG. 15, the first spring 330a, the second spring 330b, and the third spring 330c may be identical. Each of the at least three springs 330 may be disposed between the upper member 310 and the lower member 320. For example, an upper end 331a of the first spring 330a, an upper end 331b of the second spring 330b, and an upper end 331c of the third spring 330c may each be connected to the upper member 310. A lower end 332a of the first spring 330a, a lower end 332b of the second spring 330b, and a lower end 332c of the third spring 330c may be connected to the lower member 320. Each of the at least three springs 330 may surround one of the at least three pins 313. For example, the first spring 330a may surround the first pin 313a, the second spring 330b may surround the second pin 313b, and the third spring 330c may surround the third pin 313c.

Figure 16:
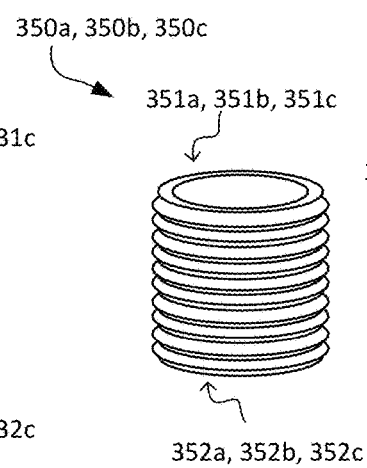
FIG. 16 is a perspective view of a bellows of the apparatus of FIG. 12A.

The bellows 350 may comprise at least three bellows. For example, the bellows 350 may comprise a first bellows 350a, a second bellows 350b, and a third bellows 350c. As shown in FIG. 16, the first bellows 350a, the second bellows 350b, and the third bellows 350c may be identical. Each of the at least three bellows 350 may be disposed between the upper member 310 and the lower member 320. For example, an upper end 351a of the first bellows 350a, an upper end 351b of the second bellows 350b, and an upper end 351c of the third bellows 350c may each be connected to the upper member 310. A lower end 352a of the first bellows 350a, a lower end 352b of the second bellows 350b, and a lower end 352c of the third bellows 350c may be connected to the lower member 320. Each of the at least three bellows 350 may surround one of the at least three springs 330. For example, the first bellows 350a may surround the first spring 330a, the second bellows 350b may surround the second spring 330b, and the third bellows 350c may surround the third bellows 350c.

Figure 17:
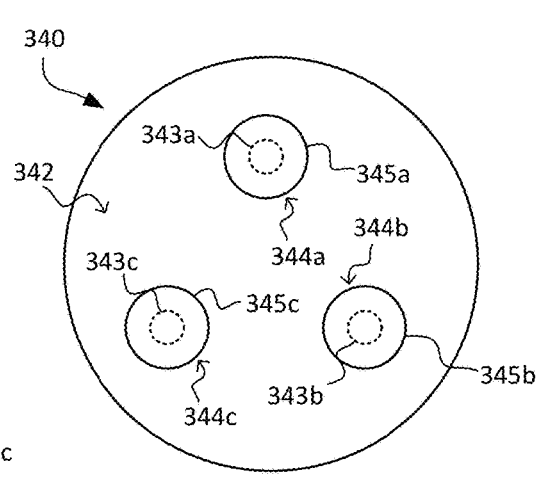
FIG. 17 is a bottom view of a base member of the apparatus of FIG. 12A.

The lower side 342 of the base member 340 may have at least three posts 343 extending downward therefrom. For example, as shown in FIG. 12A, the at least three posts 343 may include a first post 343a, a second post 343b, and a third post 343c. The at least three posts 343 may be equally spaced apart on the lower side 342 of the base member 340. For example, the first post 343a, the second post 343b, and the third post 343c may be at three concyclic points on the lower side 342 of the base member 340. Each of the at least three posts 343 may have identical structure. A free end 344 of each of the at least three posts 343 may have a spherical shape 345 with a diameter greater than a diameter of the post 343. For example, as shown in FIG. 17, the free end 344a of the first post 343a may have a first spherical shape 345a, the free end 344b of the second post 343b may have a second spherical shape 345b, and the free end 344c of the third post 343c may have a third spherical shape 345c.

The base member 340 may be configured to be coupled to the upper member 310. For example, as shown in FIG. 12B, the first post 343a, the second post 343b, and the third post 343c may be configured to be coupled to the upper member 310. When the base member 340 is coupled to the upper member 310, the base member 340 applies the load to the upper member 310, causing the upper member 310 to transition from the unloaded state to the loaded state. When the base member 340 is uncoupled from the upper member 310, the base member 340 releases the load from the upper member 310, causing the upper member 310 to transition from the loaded state to the unloaded state.

The upper side 311 of the upper member 310 may comprise at least three grooves 316. For example, as shown in FIG. 13A, the upper side 311 of the upper member 310 may include a first groove 316a, a second groove 316b, and a third groove 316c. The at least three grooves 316 may have a vee shape, and may each comprise a pair of abutment faces 317. For example, the first groove 316a, the second groove 316b, and the third groove 316c may comprise first abutment faces 317a, second abutment faces 317b, and third abutment faces 317c, respectively. The pairs of abutment faces 317 may be planar or curved. The at least three grooves 316 may be arranged 120 degrees relative to one another. When the base member 340 is coupled to the upper member, the free ends 344 of each of the at least three posts 343 may contact the pairs of abutment faces 317 of one of the at least three grooves 316. For example, the free end 344a of the first post 343a may contact the first abutment faces 317a of the first groove 316a, the free end 344b of the second post 343b may contact the second abutment faces 317b of the second groove 316b, and the free end 344c of the third post 343c may contact the third abutment faces 317c of the third groove 316c.

It should be understood that while the apparatus 300 is described as having one or three of various components, the number of these components may vary based on the particular application of the apparatus 300, where self-centering of an assembly mounted on a compliant structure may be desired. In order to constrain all six degrees of freedom, six contact points may be needed between the base member 340 and the upper member 310. For example, six assemblies may be used where each assembly provides a single contact point, or three assemblies may be used where each assembly provides two contact points.

With the apparatus 300 of the present disclosure, no manual action may be needed to transition from a rigid state to a compliant state, because the coupling load itself causes the transition to occur. This may allow repeatable centered seating of the assembly. In addition, any particles created from engagement/disengagement of the internal mechanism or chemical contamination from any lubricants used may be trapped within the body of the apparatus 300, so as not to contaminate the clean exterior environment.

Figure 18:
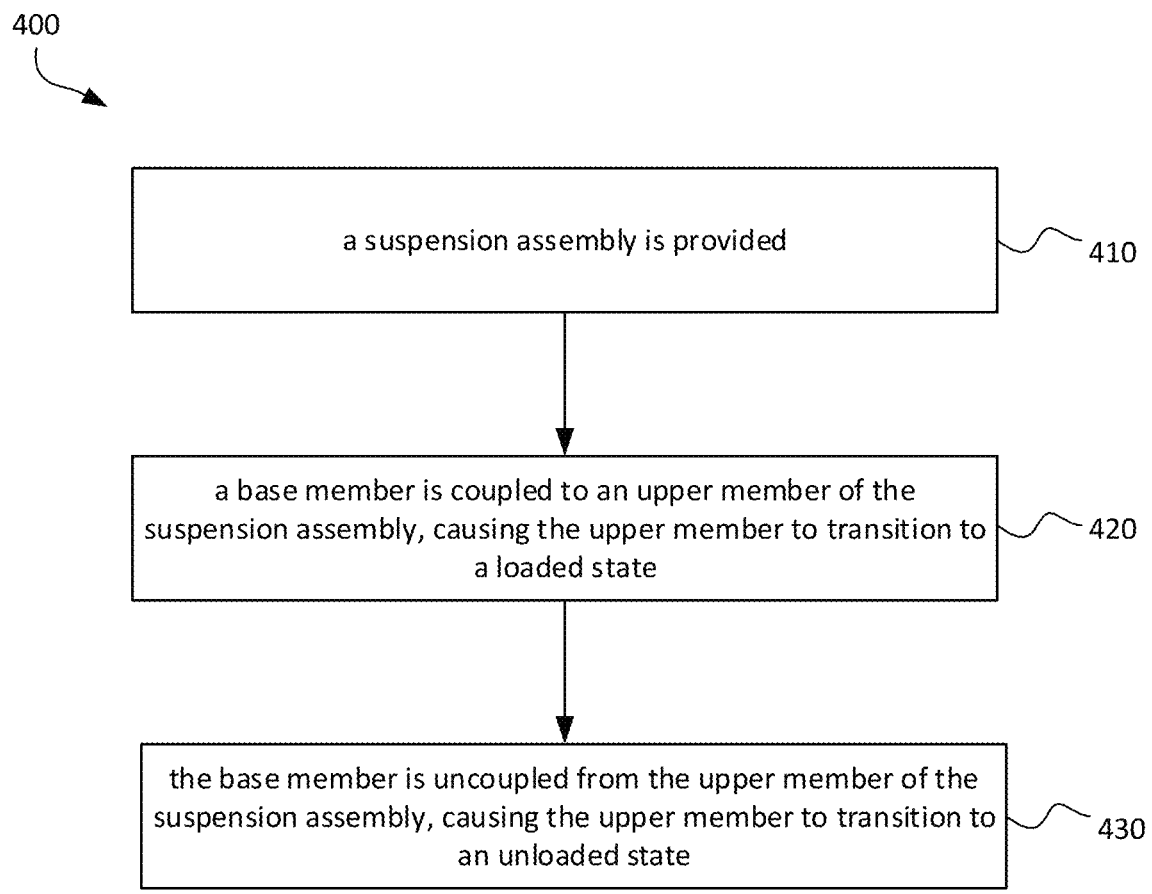
FIG. 18 is a flow chart of a method according to another embodiment of the present disclosure.

Referring to FIG. 18, an embodiment of the present disclosure provides method 400. The method 400 may comprise the following steps.

At step 410, a suspension assembly is provided. The suspension assembly may comprise components of the apparatus 300 described above in connection with FIGS. 10-11 or other embodiments disclosed herein. The suspension assembly may comprise an upper member. The upper member may have an upper side and a lower side. The lower side of the upper member may have a pin extending downward therefrom. The pin may have a cylindrical shape. The pin may have a free end distal from the lower side of the upper member. The upper member may have a circular or polygonal shape. The upper member may be configured to carry a load in a loaded state and release the load in an unloaded state.

The suspension assembly may further comprise a lower member. The lower member may be disposed beneath the upper member. For example, the lower member may be spaced apart from the upper member in the vertical direction. The lower member and the upper member may be coaxially aligned. The lower member may have a circular or polygonal shape. For example, the lower member and the upper member may have the same shape. The lower member may be a fixed constraint. The lower member may have an upper side and a lower side. The upper side of the lower member may have a seat configured to receive the free end of the pin.

The suspension assembly may further comprise a spring. The spring may be disposed between the upper member and the lower member. The spring may have an upper end connected to the upper member and a lower end connected to the lower member. For example, the upper end of the spring may be connected to the lower side of the upper member, and the lower end of the spring may be connected to the upper side of the lower member. The spring may surround the pin. For example, the spring may have an inner diameter that is greater than the diameter of the pin. The spring may have a free length (i.e., an unloaded length) that is greater than the length of the pin.

In the unloaded state, the free end of the pin contacts the seat and the spring applies a tensile force to prevent relative lateral movement between the upper member and the lower member. In the loaded state, the load applies a compressive force to the spring that forms a gap between the free end of the pin and the seat, which allows relative lateral movement between the upper member and the lower member.

At step 420, a base member is coupled to the upper member above the suspension assembly. The base member may have a circular shape. The base member may have an upper side and a lower side. The lower side of the base member may be configured to couple to the upper side of the upper member. The base member may apply the load to the upper member, causing the upper member to transition from the unloaded state to the loaded state.

According to an embodiment of the present disclosure, the method 400 may further comprise step 430. At step 430, the base member is uncoupled from the upper member of the suspension assembly. The base member may release the load from the upper member, causing the upper member to transition from the loaded state to the unloaded state.

With the method 400 of the present disclosure, no manual action may be needed to transition from a rigid state to a compliant state, because the load itself, applied by the coupling of the base member to the upper member, causes the transition to occur. Simply uncoupling the base member from the upper member may cause the assembly to transition back to the rigid state. This may allow repeatable centered seating of the assembly.

Although the present disclosure has been described with respect to one or more particular embodiments, it will be understood that other embodiments of the present disclosure may be made without departing from the scope of the present disclosure. Hence, the present disclosure is deemed limited only by the appended claims and the reasonable interpretation thereof.

What is claimed is:

1. An apparatus for fabricating semiconductor devices, comprising:
    an upper member having a pin extending downward therefrom;
    a lower member disposed beneath the upper member and having a seat configured to receive a free end of the pin, the lower member being configured to carry a load in a loaded state and release the load in an unloaded state; and
    a spring disposed between the upper member and the lower member and having an upper end connected to the upper member and a lower end connected to the lower member, such that the spring surrounds the pin, the spring having a free length that is less than the length of the pin;
    wherein in the unloaded state, the free end of the pin contacts the seat and, with the spring, prevents relative lateral movement between the upper member and the lower member;
    wherein in the loaded state, the load applies a tensile force to the spring that forms a gap between the free end of the pin and the seat, which allows relative lateral movement between the upper member and the lower member.

2. The apparatus of claim 1, further comprising:
    a base member disposed beneath the lower member and configured to couple to the lower member;
    wherein when the base member is coupled to the lower member, the base member applies the load to the lower member, causing the lower member to transition from the unloaded state to the loaded state; and
    wherein when the base member is uncoupled from the lower member, the base member releases the load from the lower member, causing the lower member to transition from the loaded state to the unloaded state.

3. The apparatus of claim 2, wherein the base member comprises a post extending upward therefrom, a free end of the post having a spherical shape with a diameter greater than a diameter of the post;
    wherein the lower member comprises an opening;
    wherein when the base member is coupled to the lower member, the free end of the post is received in the opening.

4. The apparatus of claim 3, wherein the opening comprises:
    a first portion having a width greater than the diameter of the spherical shape; and
    a second portion having a width greater than the diameter of the post and less than the diameter of the spherical shape;
    wherein when the base member is coupled to the lower member, the free end of the post is received in the first portion and the post is at least partially received in the second portion.

5. The apparatus of claim 4, wherein the lower member further comprises a pair of internal abutment faces inside the opening; and
    wherein when the base member is coupled to the lower member, the spherical shape contacts the pair of internal abutment faces.

6. The apparatus of claim 5, wherein the pair of internal abutment faces are defined by tapered surfaces connecting the first portion to the second portion of the opening.

7. The apparatus of claim 5, wherein the pair of internal abutment faces are planar, such that the spherical shape contacts one point on each internal abutment face.

8. The apparatus of claim 1, wherein in the loaded state, the free end of the pin is at least partially withdrawn from the seat.

9. The apparatus of claim 1, wherein the free end of the pin has a beveled edge and the seat comprises a countersunk hole, such that in the unloaded state, the free end of the pin is received in the seat with an annular contact surface between the beveled edge and the countersunk hole.

10. The apparatus of claim 1, further comprising:
    a bellows disposed between the upper member and the lower member having an upper end connected to the upper member and a lower end connected to the lower member, wherein the bellows surrounds the spring.

11. The apparatus of claim 10, wherein the bellows is configured to hermetically seal an interior of the bellows from an exterior of the bellows.

12. The apparatus of claim 10, wherein the bellows is elastically deformable by a length greater than or equal to the length of the gap.

13. The apparatus of claim 1, wherein the upper member comprises a fixed constraint.

14. The apparatus of claim 1, wherein the upper member has at least three pins extending downward therefrom, the at least three pins being equally spaced apart;
    wherein the lower member comprises at least three lower members, the seat of each lower member being configured to receive the free end of one of the at least three pins; and
    wherein the spring comprises at least three springs disposed between the upper member and each of the at least three lower members and each spring surrounds one of the at least three pins.

15. The apparatus of claim 14, further comprising:
    a base member disposed beneath the lower member and configured to be coupled to each of the lower members;
    wherein when the base member is coupled to each of the lower members, the base member applies the load to each of the lower members, causing each of the lower members to transition from the unloaded state to the loaded state; and
    wherein when the base member is uncoupled from each of the lower members, the base member releases the load from each of the lower members, causing each of the lower members to transition from the loaded state to the unloaded state.

16. The apparatus of claim 15, wherein the base member comprises at least three posts extending upward therefrom, the at least three posts being equally spaced apart, a free end of each post having a spherical shape with a diameter greater than a diameter of the post;
  wherein each of the lower members comprises an opening;
  wherein when the base member is coupled to each of the lower members, the free ends of each of the posts are received in the opening.

* * * * *